US 8,340,527 B2

(12) United States Patent
Elberbaum

(10) Patent No.: US 8,340,527 B2
(45) Date of Patent: Dec. 25, 2012

(54) METHOD AND APPARATUS FOR COUPLING OPTICAL SIGNAL WITH PACKAGED CIRCUITS VIA OPTICAL CABLES AND LIGHTGUIDE COUPLERS

(75) Inventor: David Elberbaum, Tokyo (JP)

(73) Assignee: Elbex Video Ltd., Tokyo (JP)

( * ) Notice: Subject to any disclaimer, the term of this patent is extended or adjusted under 35 U.S.C. 154(b) by 0 days.

(21) Appl. No.: 13/220,922

(22) Filed: Aug. 30, 2011

(65) Prior Publication Data

US 2011/0311219 A1    Dec. 22, 2011

Related U.S. Application Data

(63) Continuation of application No. 12/761,484, filed on Apr. 16, 2010, now Pat. No. 8,041,221, which is a continuation-in-part of application No. 12/632,108, filed on Dec. 7, 2009, now abandoned.

(60) Provisional application No. 61/260,040, filed on Nov. 11, 2009.

(51) Int. Cl.
*H04B 10/00* (2006.01)
(52) U.S. Cl. .................................................. 398/113
(58) Field of Classification Search .............. 398/107, 398/111, 113
See application file for complete search history.

(56) References Cited

U.S. PATENT DOCUMENTS 4,363,061 A * 12/1982 Vaerewyck et al. .......... 361/31
4,418,660 A * 12/1983 Endo et al. ................. 123/143 B
4,495,421 A    1/1985 Endo et al.

(Continued)

FOREIGN PATENT DOCUMENTS

KR    10-2004-0068433    7/2004

(Continued)

OTHER PUBLICATIONS

"Integrated Circuits and Semiconductor Devices: Theory and Application", Second Edition by G. J. Deboo et al., McGraw-Hill, 1977, pp. 271, 286-291, 315, 323-325.*

(Continued)

*Primary Examiner* — Shi K Li
(74) *Attorney, Agent, or Firm* — Katten Muchin Rosenman LLP

(57) ABSTRACT

Method and apparatus for coupling electrical and communication circuits, included in a packaged semiconductor comprising photo receivers, photo transmitters and photovoltaic cells, through lightguide and optical fiber cables. The packaged semiconductor combinations comprise one, two or plurality of photo elements for a single or plurality one way optical signal, receive or transmit, and a single or plurality of two way optical signal communications via direct optical links and via optical prisms, filters, half mirrors and lenses. The packaged semiconductor includes at least one optical access to a single or plurality of lightguides or optical fiber with single core and for multicore lightguides. A built-in or attachable holders are used for attaching the different lightguide cables to the one or plurality of optical accesses with the attached cable end is terminated by cutting, trimming and shaping. The packaged circuit comprising electrical switches, current sensors, basic elements such as diodes, transistors and FETs, switches and power switches and different basic electrical circuit and communication, distribution circuits including CPU, DSP and complex semiconductor circuits, as used for communicating within limited short distances through optical network of lightguides and fiber optical cables. A packaged semiconductor of an SPDT power switch circuit is integrated with an SPDT manually activated switch, for providing dual switching for lights and other electrical appliances, via manual action and remotely via the lightguide or the optical fiber.

30 Claims, 10 Drawing Sheets

U.S. PATENT DOCUMENTS

| | | | |
|---|---|---|---|
| 4,592,360 A | | 6/1986 | Lesnick |
| 4,705,960 A | * | 11/1987 | Lovrenich ............... 307/149 |
| 4,863,233 A | * | 9/1989 | Nienaber et al. .......... 385/89 |
| 4,989,081 A | | 1/1991 | Miyagawa et al. |
| 4,993,395 A | * | 2/1991 | Vogel et al. ............. 123/643 |
| 5,142,397 A | | 8/1992 | Dockery |
| 5,237,441 A | * | 8/1993 | Nhu ..................... 398/136 |
| 5,323,256 A | | 6/1994 | Banks |
| 5,754,637 A | | 5/1998 | Choi |
| 5,828,801 A | | 10/1998 | Sakamoto |
| 5,923,363 A | | 7/1999 | Elberbaum |
| 6,133,833 A | | 10/2000 | Sidlauskas et al. |
| 6,188,495 B1 | | 2/2001 | Inoue et al. |
| 6,239,718 B1 | | 5/2001 | Hoyt et al. |
| 6,249,673 B1 | | 6/2001 | Tsui |
| 6,405,261 B1 | | 6/2002 | Gaucher |
| 6,535,110 B1 | | 3/2003 | Arora et al. |
| 6,603,842 B2 | | 8/2003 | Elberbaum |
| 6,712,527 B1 | | 3/2004 | Chan et al. |
| 6,940,957 B2 | | 9/2005 | Elberbaum |
| 7,046,185 B2 | | 5/2006 | Griesau et al. |
| 7,290,702 B2 | | 11/2007 | Elberbaum |
| 7,319,978 B2 | | 1/2008 | Minamishin et al. |
| 7,461,012 B2 | | 12/2008 | Elberbaum |
| 7,548,246 B2 | | 6/2009 | Huang et al. |
| 7,556,439 B2 | * | 7/2009 | Nakanishi et al. ........... 385/92 |
| 7,605,358 B2 | | 10/2009 | Suzuki et al. |
| 7,639,907 B2 | | 12/2009 | Elberbaum |
| 7,802,927 B2 | | 9/2010 | Benjamin et al. |
| 2005/0089333 A1 | | 4/2005 | Margalit |
| 2005/0184374 A1 | * | 8/2005 | Ohe et al. ............... 257/678 |
| 2005/0273820 A1 | | 12/2005 | Elberbaum |
| 2006/0019679 A1 | | 1/2006 | Rappaport et al. |
| 2006/0138231 A1 | | 6/2006 | Elberbaum |
| 2006/0192663 A1 | | 8/2006 | Bryan et al. |
| 2008/0068207 A1 | | 3/2008 | Elberbaum |
| 2008/0260326 A1 | | 10/2008 | Yabre et al. |
| 2008/0290990 A1 | | 11/2008 | Schaffzin et al. |
| 2009/0103228 A1 | | 4/2009 | Elderbaum |
| 2010/0052863 A1 | | 3/2010 | Renfro, Jr. et al. |
| 2010/0278537 A1 | | 11/2010 | Elberbaum |

FOREIGN PATENT DOCUMENTS

| | | |
|---|---|---|
| KR | 10-2005-0081505 | 8/2005 |
| KR | 10-2006-0031134 | 4/2006 |
| WO | 2005/125189 | 12/2005 |

OTHER PUBLICATIONS

United States Office Action dated Apr. 4, 2011, from corresponding U.S. Appl. No. 12/761,484.

Written Opinion of the International Searching Authority and International Search Report dated Mar. 27, 2009, from the corresponding International Application. An IDS filed in U.S. Appl. No. 11/939,785, now U.S. Patent No. 7,639,907.

International Preliminary Report on Patentability dated Mar. 5, 2009 and Written Opinion of the International Searching Authority dated Feb. 24, 2009, from the corresponding International Application. An IDS filed in U.S. Appl. No. 11/509,315, now U.S. Publication No. 2008/0068207.

United States Office Action dated Aug. 19, 2009, from corresponding U.S. Appl. No. 11/509,315, now U.S. Publication No. 2008/0068207.

United States Office Action dated Dec. 24, 2009, from corresponding U.S. Appl. No. 11/509,315, now U.S. Publication No. 2008/0068207.

United States Office Action dated May 26, 2011, from corresponding U.S. Appl. No. 12/761,484.

International Preliminary Report on Patentability and Written Opinion of the International Searching Authority dated May 24, 2012, from corresponding International Application No. PCT/US2010/055894.

* cited by examiner

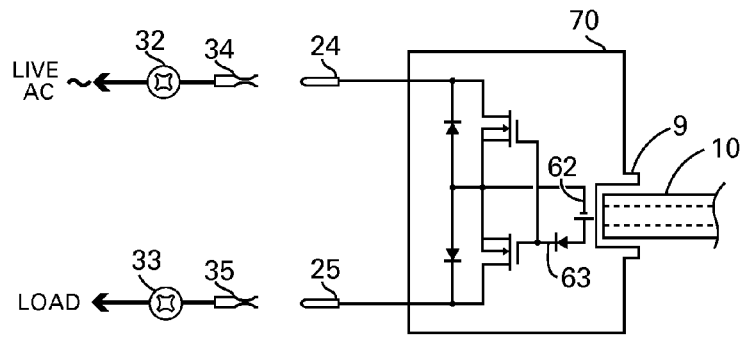
FIG. 5A
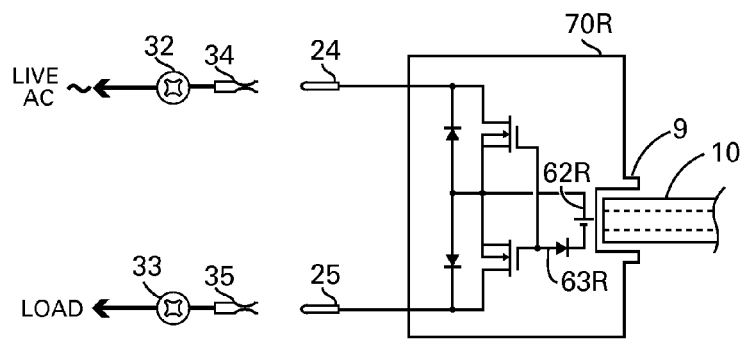
FIG. 5B
FIG. 5C
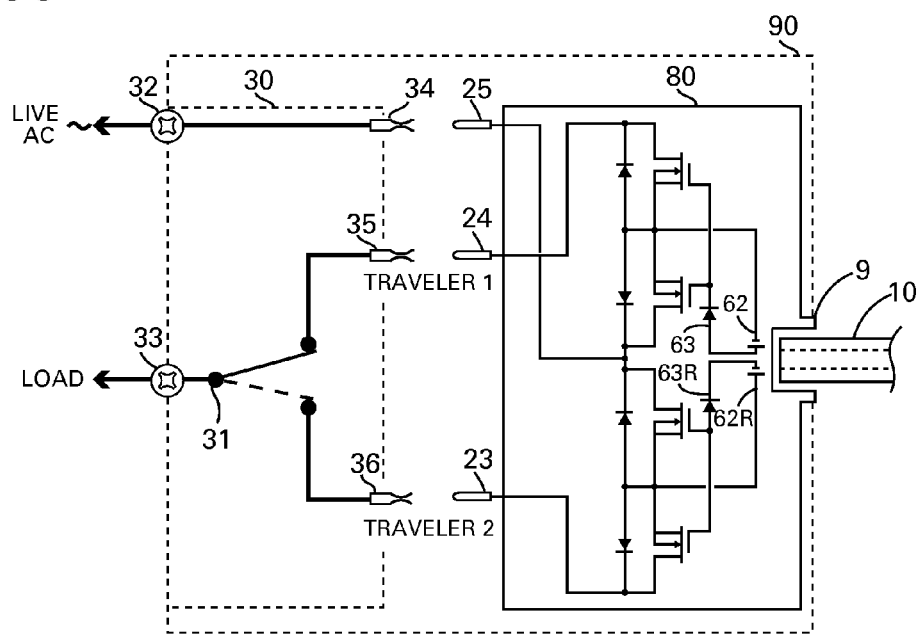

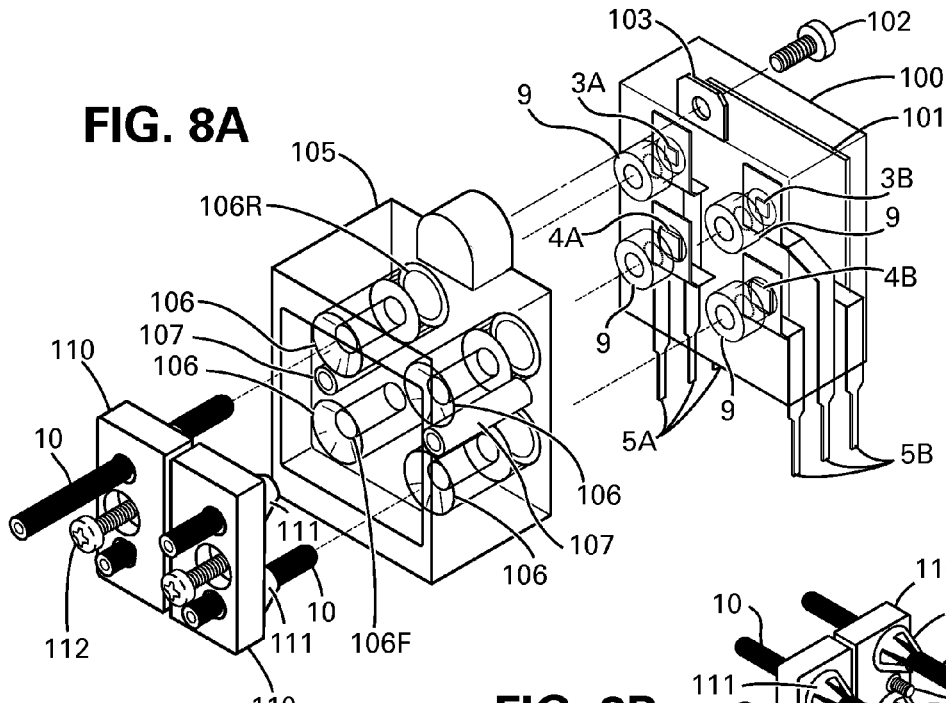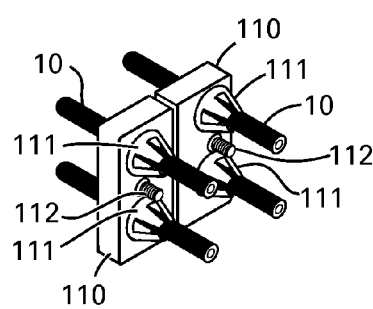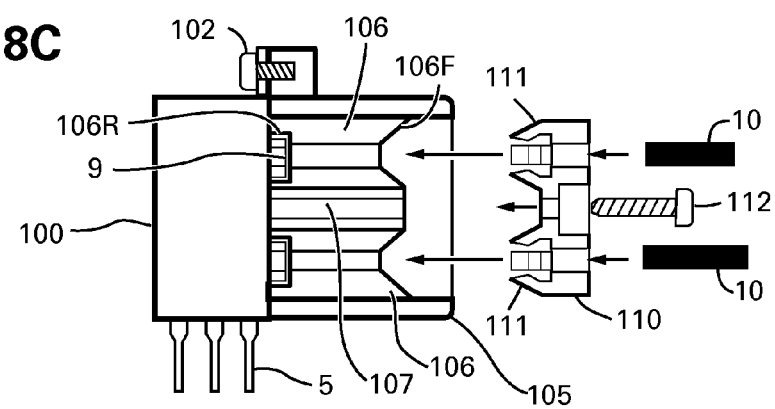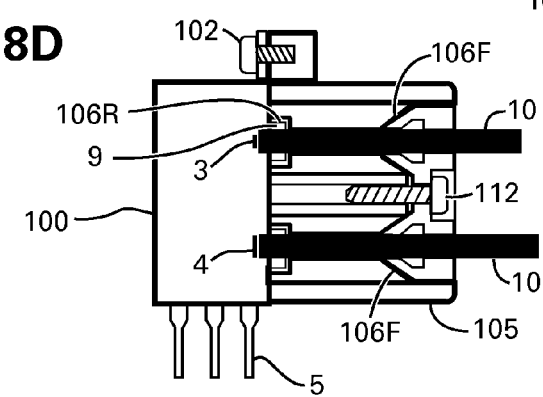

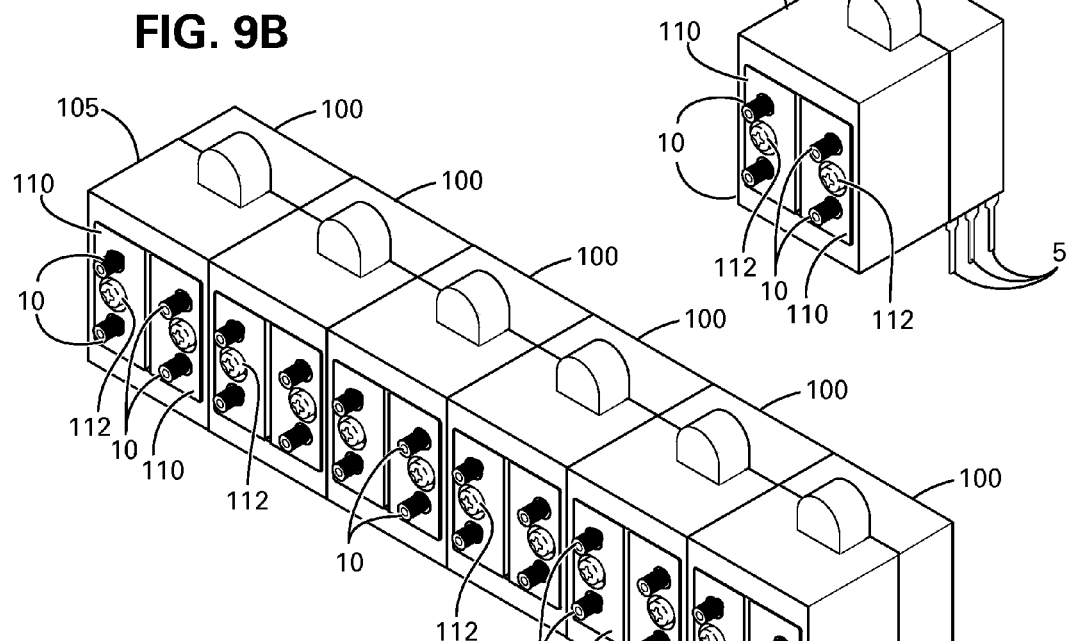

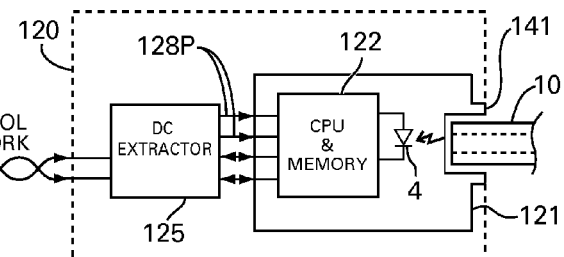
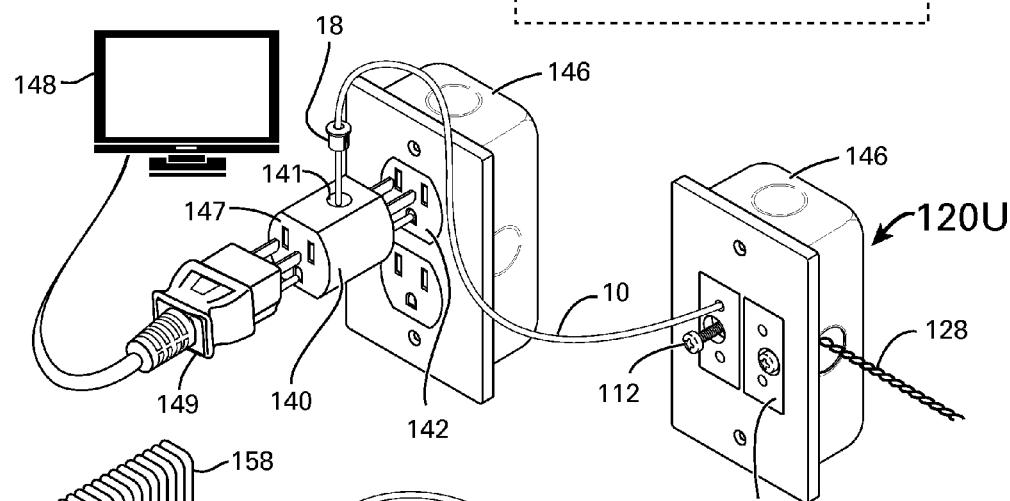
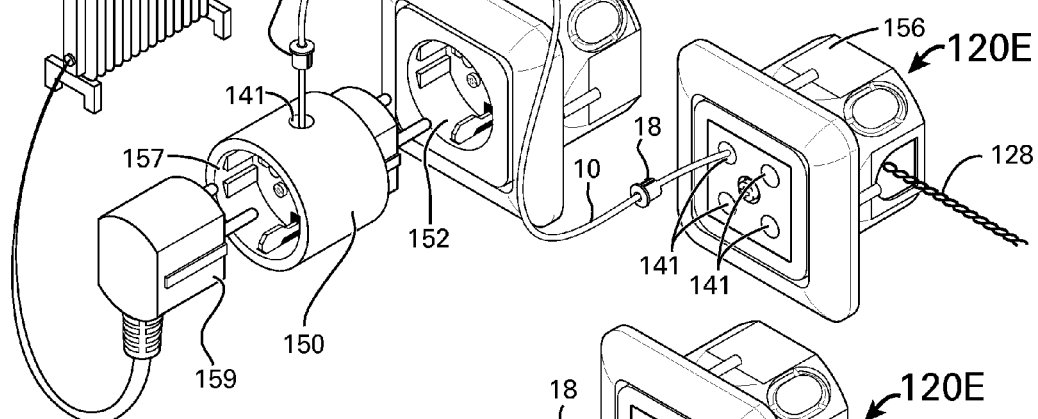
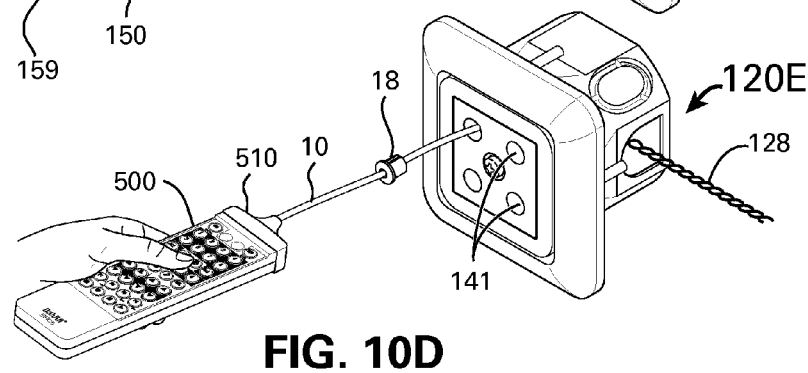

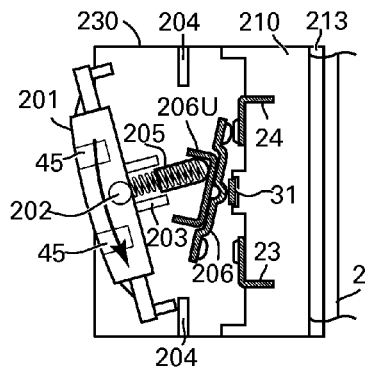
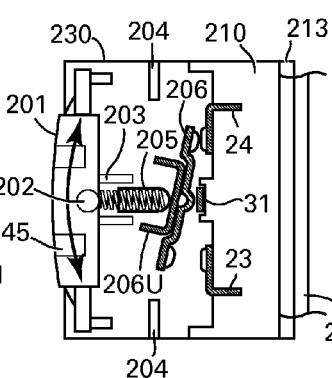
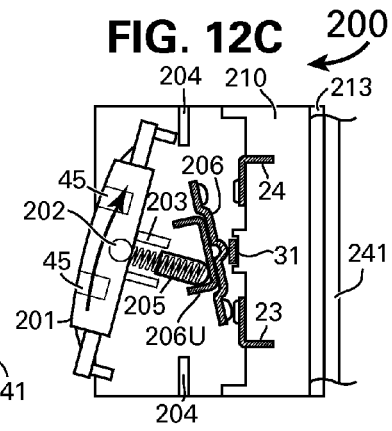
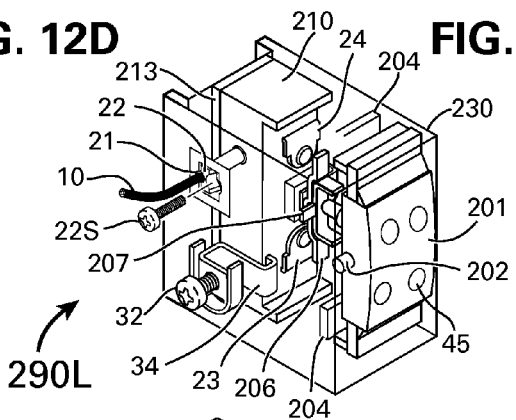
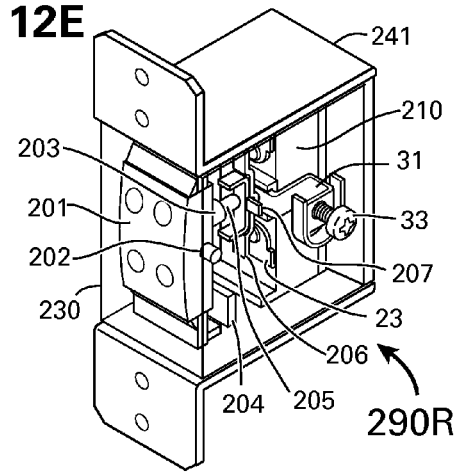
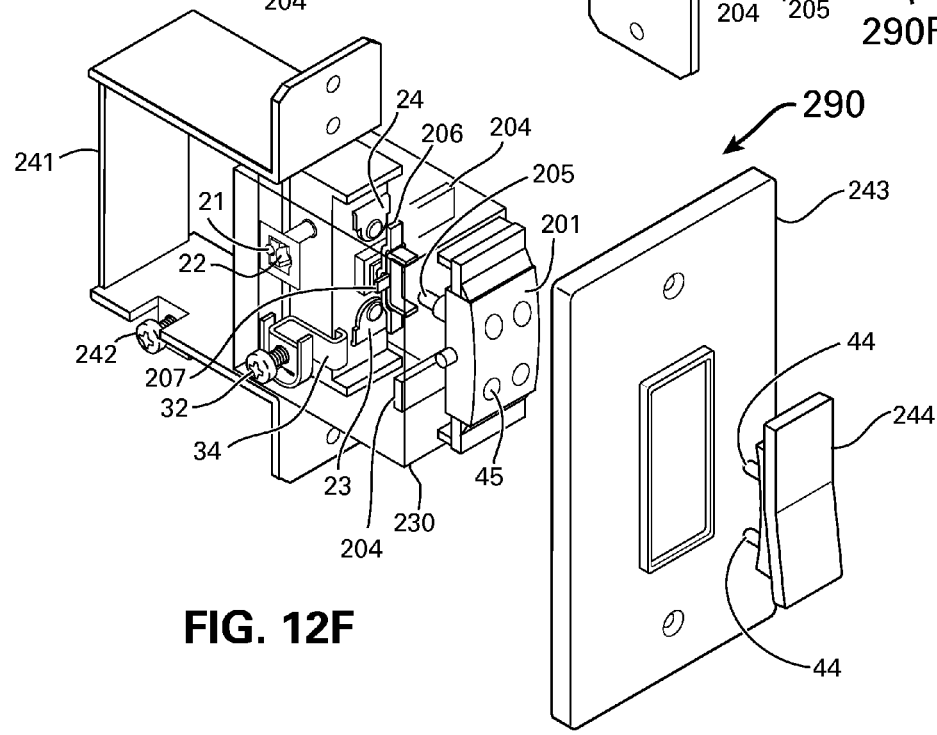

US 8,340,527 B2

METHOD AND APPARATUS FOR COUPLING OPTICAL SIGNAL WITH PACKAGED CIRCUITS VIA OPTICAL CABLES AND LIGHTGUIDE COUPLERS

BACKGROUND OF THE INVENTION

1. Field of the Invention

This invention is related to propagation and/or feeding of optical signals via lightguide and plastic optical fibers to a photovoltaic and photocoupler devices comprising switches, MOSFET, transistors, thyristors, triacs and photo relays for use with electrical and communication devices and appliances of home, office and factory automation and communications medium.

2. Description of the Prior Art

Wired or wireless control devices are used for remotely operating AC or DC powered electrical devices and appliances such as heaters, air conditioners, motors and motorized devices, lighting and other electrical appliances in homes, apartments, offices, factories and buildings in general to switch the appliances on-off.

The switching and relay devices that are available for switching appliances on-off and/or for setting or commanding operation levels, such as dimming the lights via triacs or FET switches or via thyristors, are manually operated or are wired to a remote controller via a network, known as low voltage network. Low voltage network cannot be connected to the electrical switching device within the same wall box. Low voltage network along with the power line connection is prohibited by the electrical and building codes in most of the world countries.

The codes however delayed the introduction of low cost simple solutions for automated switching and controlling of electrical appliances and lights. Now, as the demand for reduction in electrical power consumption is prevailing and the need for a programming of the many switches and other electric and electronic devices in the buildings and factories is becoming clear, a simple solution other than low voltage wires, was needed for propagating and feeding control and communication signals to the power line switches and other control devices inside an electrical box, in which power lines are connected.

Interconnection via hard wires (copper) between or inside electrical and communication devices are similarly prevented by different ground potentials or different signaling levels or power line potentials. The use of photocouplers overcome the limitations involving different potentials at their interconnecting points. An extensive range of well known photo coupling devices are available in different packages and are offered to the electrical, electronic and communications industries throughout. In all the known photocouplers it is required that a current signal is fed to an LED or laser embedded into an IC package and other packages, or individually mounted for propagating optical signal to a pin diode or photo transistor, or other optical or photovoltaic receiving structures on the opposite side, thereby cutting any current flow between the input terminals of the transmitter and the output terminals of the receiving devices or structures.

Even though the input and the output of a photocoupler are electrically insulated, such photocouplers do not overcome the electrical and building codes limitations because the input and the output terminals of the photocoupler devices need to be hard wired and such wires or connections cannot be introduced along side or together with the AC electrical wiring systems of buildings and factories in the advanced countries of the world.

A solution for such limitation, in which relays and dimmers inside an electrical wall box are connected by lightguide or optical fiber cables, is disclosed in U.S. patent application Ser. No. 12/236,656 filed on Sep. 24, 2008 and is incorporated herein by reference.

However the lightguide solution disclosed in the above U.S. patent application Ser. No. 12/236,656 teaches the use of photo transistor and/or pin diode along with other circuits for providing one or two way communication between a controller and a switch, a relay or a dimmer device, involving number of parts and components assembled into a small packaged device that add to the manufacturing cost.

Prior arts disclosed in the above referenced U.S. application Ser. No. 12/236,656 and in the U.S. application Ser. Nos. 11/874,309 dated Oct. 18, 2007 and 11/939,785 dated Nov. 14, 2007 also teach the detection of a current flow through the switches, dimmers and power outlets for feeding to a controller current drain information such as power on or off state, or stand by and/or a specific data pertaining the current drain of a given appliance. Such data is detected via current sensor and propagated by a transmitting device such as LED through a lightguide or optical fiber cable to the controller.

The prior art in the U.S. application Ser. No. 12/236,656 discloses a single lightguide for propagating one way control commands from a controller to a switching device. It also discloses dual lightguides for propagating two way, one way for propagating commands to the switching device and in reverse direction propagating a returned data from the switching device. It further discloses the use of optical prism including half mirror structure to propagate commands to the switch and a returned data such as current drain or the load state from the switch via a single lightguide or optical fiber.

As stated above the costs to manufacture the devices disclosed in the U.S. application Ser. No. 12/236,656, including the IR or visual light transmitter and receiver and their associated circuits, parts and components into the limited space of a switching device are higher than the commonly used mechanical switches and devices and a simpler structure enabling the interconnections of optical signals via lightguide or an optical fiber at a lower cost is needed.

Similarly, the light transmission material such as silicon that fills the space between the photo transmitter and the photo receiver and its thickness, used in the well known photocouplers, represent two opposing conditions with their internal structure. The codes and rules governing insulation specify a testing procedure with very high voltages that are applied between the input and the output terminals of the photocoupler, this mandates the increase in the thickness of the silicon or the light transmission material between the LED and the photo transistor or other receiving structure. The increase in material thickness means increase in distance for the IR or visual light transmission, which reduces exponentially $$\left(\frac{1}{\text{distance}^2}\right)$$

the light or IR reaching the optical receiver, and therefore reduces the sensitivity, the response time and increase the noise susceptibility. A simpler and improved method and apparatus are needed for photocoupling solutions.

SUMMARY OF THE INVENTION

The first object of the present invention is to provide a method and apparatus for directly connecting lightguides or optical fibers between photoelectric and photovoltaic receivers of a packaged semiconductors devices on one end, and an LED or laser transmitters of a packaged semiconductor devices on the other end, for communicating optical signals comprising visual light, UV or IR signals and interconnecting the transmitter-receiver circuits that are apart. For example the photo transmitter and the photo receiver are mounted on the same printed circuit board but need to be electrically insulated by communicating optical signals. Another example is the need to insulate the control signal in a designated electrical box, for operating AC and/or DC power switches, light dimmers and other AC and/or DC power devices from low voltage control signals. Further such power devices may include an AC or DC current sensor or a sensing circuit of a semiconductor transmitter package such as hall sensor for outputting optical signal of current drain and state, such as on-off, stand by or other current sensing level and data disclosed in the above referenced U.S. patent application Ser. Nos. 11/874,309, 11/939,785 and 12/236,656.

The lightguide coupler packages of the present invention include at least one photo or opto element selected from a group of a pin photo diode, a photo diode, a photo diode array, a photovoltaic cell, a photo diac, a photo thyristor, a photo triac, a photo transistor, an optocoupled MOSFET (OCMOSFET), a LED, a laser and combinations thereof.

Another object of the present invention is to operate and monitor the state of the electrical appliances through a video interphones and/or "shopping terminals" and/or via a communication network including the generating of control codes and signals by the video interphones and shopping terminals or by other dedicated controllers to the different appliances, using a driver circuits as described in the U.S. application Ser. No. 11/509,315 or other driver circuits. "Shopping terminals" are disclosed in the U.S. Pat. No. 7,290,702. Video interphones systems are disclosed in U.S. Pat. Nos. 5,923,363, 6,603,842 and 6,940,957.

Yet, another object of the present invention is to provide for interconnecting communication circuits, such as used in hubs, network switches and routers and PCs by including photo transmitters and photo receivers into their communication ICs and adapting the integrated packages with lightguide holders for accommodating a similar simple introduction of lightguides and optical fibers for interconnecting such communication devices with electrical systems or residences or home automations that cannot be connected via copper wires.

The terms photo, or opto, or optical relating to elements, parts, structure and techniques in the following description are one of the same.

In the following description the term photocoupler refers to the well known different integrated semiconductor packages incorporating at least one internal optical link between optical transmitter, such as LED or laser and an optical receiver, such as photo diode, photo transistor, or photovoltaic cell.

In the following description the term lightguide coupler refers to an integrated semiconductor circuit package incorporating among its structured elements optical elements termed as optical transmitter or transmitter and/or optical receiver or receiver and/or photovoltaic cell, also termed a receiver. The package includes an optical access aligned with the optical receiver, or the optical transmitter or both. The package may be constructed with (built-in) lightguide holder structure for introducing the lightguide or an optical fiber to the optical access, or such lightguide holder may be a separate structure for attachment to the package.

In the following description the term live AC refers to the "hot line" of the AC power or mains, as opposed to the neutral line of the AC power or mains. The term load refers to an appliance, such as light fixture that is connected between the neutral line and the live AC line via a mechanical on-off switch, a relay, MOSFET, triac or a dimmer.

The term contacts in the following descriptions refers to pins, solder pins, surface mount contacts, surface mount terminals, plugs, sockets, posts, blades, terminal blocks, screw terminals, crimp terminals, fast on terminals, solder terminals, solder contacts, and combinations thereof, as used for connecting the circuits of the lightguide coupler of the present invention.

In the following descriptions the term transmitter refers to an LED, laser or other optical emitting devices that transform electric signals into UV, IR or visual light signals.

The term transmitting refers to a UV, IR or visual light emission from a transmitter, in air such as from hand held remote control or into lightguides or optical fibers.

The term receiver refers to a photo diode, pin diode, photo transistor or other photovoltaic or photoelectric receivers that convert UV, IR or visual light into electrical signals or electrical charge.

The term receiving refers to the receiving of UV, IR or visual light, in air in line of sight, such as from an hand held IR remote control, or via lightguides or optical fibers onto a bare surface of the receiver or via a transparent materials including prisms, half mirrors, lenses, filters and other optical structures.

The term transceiver refers to a combined transmitter and receiver including a transceiver comprising LED and photo diode or photo transistor embedded into a semiconductor package or LED and photo diode or photo transistor attached to an optical prism for propagating two way optical signals through a single optical cable such as the lightguides or the optical fibers by deflecting or directing a received optical signal to the receiver and allowing the transmitted optical signal to pass into the optical cable. The term transceiver includes a transceiver that propagates two way optical signals via two optical cables.

The term optical prism refers to a structure for deflecting and/or separating two way optical signals (the received and the transmitted optical signals) propagated via the prism and via a single lightguide or optical fiber. Said prism comprises an optical device selected from a group of polarizing optical filters, given visual wave length pass filters, visual band pass filters, given wave length UV pass filters, given wave length IR pass filters, given wave length UV cut filters, given wave length IR cut filters, half mirrors with a given reflectance values and combinations thereof, wherein said filters and/or said half mirrors form said prism or are attached to said prism and/or are coated onto said prism and/or are introduced into the prism material in the form of a tint, particles or a process. Further details of a prism structure disclosed in the U.S. patent application Ser. No. 12/236,656 are incorporated herein by reference.

Even though an UV, IR or visual light is recited individually in the following descriptions, the UV, IR and the visual light term may refer to all. The term light, UV, IR or visual light is used alternately to an optical signal and should not be restrictive to the one or the other, unless it is so described.

The terms controller or control device refer to a system controller that controls switches and other devices via a control line, known as low voltage or bus line, for propagating one way or two way commands and communications. The control line may feed a low power such as 12 VDC to the devices. The controller also propagates optical signals (light, UV, IR or visual light signals) for communicating with the AC or DC switching devices that include one or two way optical communication circuits and holders for lightguides or optical fibers. The term low voltage line refers to the controller's control line.

The term current sensor refers to a DC current sensor for detecting a DC current drain through a DC power line and/or an AC current sensor for detecting the AC current drained through an AC power line wire or through a switching device, including magnetic field detection by hall sensors or detection by induction disclosed in the above referred to U.S. patent application Ser. Nos. 11/874,309, 11/939,785 and 12/236,656 and/or for generating current drain state via one way or two way optical signal.

The term pending US applications refers to the U.S. patent application Ser. Nos. 11/874,309 and 11/939,785 applied on Oct. 18, 2007 and Nov. 14, 2007 respectively and the U.S. patent application Ser. No. 12/236,656.

The method and apparatus for connecting photovoltaic and photoelectric couplers and relays for remotely operating AC or DC powered appliances and other objects of the present invention are attained by introducing a lightguide or optical fiber between lightguide couplers of the present invention. One of the lightguide coupler is included in a low voltage controller that receives and transmits electrical command and communication signals and uses the lightguide coupler of the present invention for converting the signals into optical signals for communicating one or two way UV, IR or light signals, including on-off commands via a lightguide or optical fiber cables to a reciprocal lightguide coupler included in a switch or an electrical appliances for operating the appliance.

The lightguide coupler of the present invention can be included in any type of electrical appliance, such as lighting appliances and LEDs illuminators, kitchen appliances, audio and video appliances, heating and cooling appliances, ventilation, washing and drying appliances, gardening appliances and any other appliances used in homes, residences, offices, shops and factories for controlling the appliance via a lightguide or optical fiber cable. Alternatively, the lightguide coupler can be introduced into a power switch and/or a dedicated controller of an appliances, such as an air condition controller that is separate from the appliance, for operating the appliance and/or switching it on-off via the lightguide with lightguide couplers or other optical devices of an AC or DC power switching device. And to receive optical signal confirming the power current drain from the connected electrical appliances that generate a returned optical signals, such as on-off state or standby state from the appliances or the power switches.

The current drain or the on-off state data is sent in response to the received operational command, such as on-off, or in response to an inquiry command (a request for data) on the basis of the current sensor output, thereby providing error free remote controlling of the electrical home appliances.

Another object of the present invention is to provide high speed optical communication in homes or offices and the like, by connecting low cost single or dual lightguides or optical fibers directly between two lightguide couplers, including optical communications between communication semiconductor packaged devices that include photo elements and optical links of the present invention, constructed to include optical accesses to lightguides and optical fibers mingled with electrical systems.

The method of combining a packaged lightguide coupler-AC switching devices and/or current sensor devices with an existing standard electrical switches and outlets, similar to the disclosures in the pending US patent applications, offer several major advantages; one is the lowering of the overall cost of the combined remotely controlled switches and outlets, because standard low cost, mass produced switches and outlets can be used. The second advantage is achieved by joining a lightguide coupler semiconductor packaged switch with a manual switch. The combined joint "lightguide controlled and manually operated switch" can be directly structured onto a packaged lightguide coupler semiconductor switch or they can be joint by plug-in or via screw attachment or otherwise to provide dual operation, manual operation via the commonly used switches and outlets on one hand and remote operation, in parallel with the manual operation, via the lightguide coupler packaged switch. These advantages are the other objects of present invention, attained in total harmony and with no conflict between the manual and remote switching operation as described in the pending US applications.

The pending US applications teach the use of two types of switches for AC appliances and light fixture, namely a single pole-double throw (SPDT) switches for on-off switching of a given appliance such as switching light fixture from two separate locations. In instances were three or more switches are needed to switch the same light fixture on-off, another type of dual pole-dual throw (DPDT) switches connected in a given straight-cross configuration in between the two SPDT switches described above. The DPDT switches are also known as "cross" or "reversing" or 4 way switches.

Accordingly one of the objects of the present invention is to introduce a lightguide to a lightguide coupler-SPDT MOSFET or triacs or thiristors and similar switching elements attached to or structured onto a manual SPDT light switch for operating a light fixture or other electrical appliance, thereby maintaining the operation via a "commonly used" manual switch and provide remote switching via SPDT lightguide coupler semiconductor switch connected to the switch in a given configuration.

Another object of the present invention is to introduce a lightguide for propagating commands to an SPDT lightguide coupler for remotely switching on-off light fixture or other electrical appliance in a system connected to a manual SPDT switch and to a more comprehensive switching setup that includes two SPDT and one or more DPDT switches.

The AC or DC SPST (Single Pole Single Throw) or SPDT lightguide coupler switches can use MOSFET switches also known as Optical CMOSFET or OCMOSFET switches or semiconductor relay (SSR). Unlike typical photo transistor that generate photo current on the basis of the light level that is emitted by an LED, the OCMOSFET uses photovoltaic cells that charge the gate capacitance to increase the gate source voltage thereby turning on the OCMOSFET. This is correct for the "Normally open" OCMOSFET, termed also as "make-type contact" MOSFET. The other "break-type contact" OCMOSFET that is "Normally closed" or a conducting MOSFET, connects the photovoltaic cells reversibly to charge and bias the gate capacitance with reverse gate source voltage when the LED is lit, cutting off the current via the OCMOSFET.

As it will be explained the use of two OCMOSFET, a commonly open and a commonly closed, or the structuring of a combined dual OCMOSFET into a single semiconductor structure that is adapted to include an optical access and a holder for introducing a lightguide to switch on-off an OCMOSFET by illuminating the photovoltaic cell, is a perfect solution for providing AC/DC high voltage SPDT switch for integrating such switch in many power combinations and circuits.

Similar structures can be applied to other AC switches, such as thyristors, triacs and diacs, all can be packaged into a semiconductor structure, adapted to access, hold and lock lightguides or optical fibers of the present invention.

Because no data is fed to the controller from the manual switch itself, the use of SPDT lightguide coupler as an "add on device" to a manual SPDT switch may confuse the control system, as it will not be possible to remotely identify the on-off state of the appliance. When several SPDT and DPDT switches are connected in a given circuit it will be much more complex to identify the on-off state, because the data relating to all the switches of the given circuit must be transmitted to the controller. Even if such data was available it mandates the recording of all the manual switch's particulars when programming the controller during the installation, which is complicated, troublesome and prone to errors. Even if it was possible it will add complicated data handling, requiring the transmitting of all the switch's data every time a manual switch or a lightguide coupler is activated in the system, and this in return introduces substantially more data traffic and processing. For the above reasons, there is a need for the current drain data.

Because of the above, the another important object of the present invention is therefore, the introduction of lightguide coupler-current sensor for identifying when the appliance is switched on or off or is in a standby mode. Here too, the connecting of live AC power line to an electrical circuit (current detector) mandates a compliance with the electrical safety laws, rules and regulations along with the electrical and building codes and it cannot be connected to low voltage communication line inside the same electrical box, but the lightguide coupler-AC current sensor of the preferred embodiment of the present invention can be connected to the AC line for generating an optical signal via a lightguide or an optical fiber. Yet, the current detector or sensor can be an AC current detector by induction, as disclosed in the pending US applications, or by a magnetic field sensor such as hall sensor.

When the current consuming appliance is a television and the electrical AC outlet to which the television is plugged to is not provided with a current sensor disclosed in the pending US applications, the on-off state of the television set remains unknown to the home automation controller. For this reason a lightguide coupler-AC current sensor can be introduced into an AC plug adapter for using a lightguide cable to propagate an optical signal representing the current drain and feed the current drain optical signal to a lightguide coupler-current data receiver of the present invention.

For example a television receiver can be powered via a standard AC outlet with its AC cable plugs into said AC plug adapter. While the power on command to the television may be transmitted via an hand held IR remote control or via an IR repeater disclosed in the pending US applications and/or through the video interphone and/or the shopping terminal, the optical signals from the AC current sensor of the plug adapter are fed to the lightguide coupler-current data receiver of the present invention, and from the current data receiver through a low voltage communication line to a dedicated home automation controller, the video interphone or the shopping terminal.

The current data is fed in return to a transmitted power-on command, for example to the television receiver, thereby confirming that the television power is on. By such return confirmation the home automation controller, the video interphone or the shopping terminal are updated at all times with the television and other appliance's "on state", or "off state" if the command was to switch off the appliance.

The reference to home automation controller hereafter is to a panel with control keys or touch screen and circuits similar to the video interphone and/or the shopping terminal disclosed in the US patents and the pending US applications.

BRIEF DESCRIPTION OF THE DRAWINGS

The foregoing and other objects and features of the present invention will become apparent from the following description of the preferred embodiments of the invention with reference to the accompanying drawings, in which:

FIGS. 5A~5C are electrical drawings of the AC or DC switching OCMOSFETs shown in FIGS. 4A~4C adapted to accommodate a lightguide or optical fibers of the preferred embodiment of the present invention;

FIGS. 8A~8D are perspective views of the lightguide coupler with a lightguide holder with a locking plug and a cross sectional views of the lightguides attachment to the lightguide coupler with the holder combined;

FIGS. 9A~9D are perspective views of an assembled lightguide coupler for dual two way optical propagation, an array of the lightguide couplers, and the attachment of multicore lightguide cables to the lightguide couplers;

FIG. 10A is an electrical block diagram of a lightguide coupler-current data receiver of the preferred embodiment;

FIGS. 10B and 10C are perspective illustration views of the interconnecting US and European electrical appliances through a lightguide coupler-current sensing adapter of the present invention;

FIG. 10D is a perspective illustration of an optical transmitter for installing data into lightguide couplers of the present invention;

FIGS. 12A~12C are cross sectional views of the manual switching through the structure of the combined lightguide coupler semiconductor packaged terminals.

FIGS. 12D and 12E are perspective views of the combined manual and lightguide photo coupler semiconductor switch of the preferred embodiment of the present invention.

FIG. 12F is an exploded view of the combined switch shown in FIG. 12B including its well known front cover and key lever.

DETAILED DESCRIPTION OF THE PREFERRED EMBODIMENTS

Figure 1A:
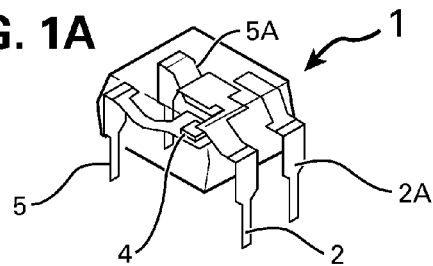
FIGS. 1A and 1B are a perspective view and a cross sectional view respectively of a typical photocoupler.
Figure 1B:
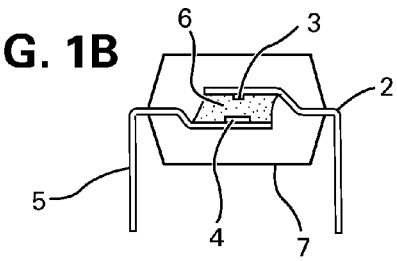

FIG. 1A shows a typical photocoupler 1 comprising a light transmitter, such as LED 3 of FIG. 1B and a light receiver, such as photo transistor 4 with both the transmitter and the receiver facing each other surface and are optically centered. The transmitter 3 (LED) is connected to and supported by the terminals 2 and 2A and the receiver 4 is connected to and supported by the two terminals 5 and 5A. The input terminals 2 and 2A of the photocoupler 1 are used for receiving electrical input signal and the output terminals 5 and 5A are used for outputting an optical insulated electrical signal. The photocoupler 1 is packaged in a plastic enclosure 7 shown in FIG. 1B. The LED is shown positioned on the upper side and the photo transistor is shown at the bottom side, but this setup can be reversed, or both can be mounted vertically to left and right side of the photocoupler package 7.

FIG. 1B shows a cross section of the photocoupler structure and the material 6 filling the space between the LED 3 and the photo transistor 4 must be good insulating material with perfect transparency for light, IR or UV transmission. The material 6 thickness, or the distance between the LED 3 and the photo transistor 4 are very important, because of the conflict involving the material thickness. Thicker material offers higher insulation to higher voltages, yet the thicker material means less light reaching the photo transistor. Illumination decreases with the square of the distance and thus, thicker insulation reduces the amount of light, IR or UV that reaches the photo transistor. Accordingly thicker insulation reduces the photocoupler sensitivity, the response time and increases the noise susceptibility, all of which cause decrease in the performances of a photocoupler.

Figure 2A:
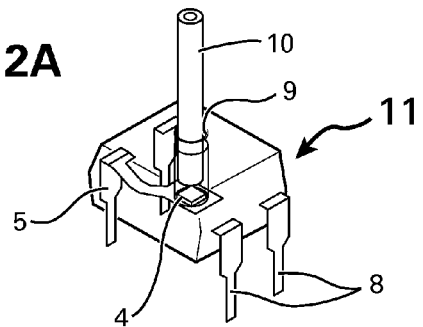
FIGS. 2A and 2B are a perspective view and a cross sectional view of the typical photocoupler shown in FIGS. 1A and 1B, adapted to accommodate a lightguide or a optical fiber of the present invention.

FIG. 2A shows a perspective view of the lightguide coupler 11 of the present invention, wherein the photo transistor surface or the receiver 4 is exposed through an access facility 9 to a lightguide 10. The lightguide 10 is a perfect insulator and it can be placed at a thin film distance 6 as shown in the cross section of FIG. 2B. There can be no insulation issue with the lightguide 10 because no metal holder or terminals or other conductive material are introduced. There is no connection to a low voltage line terminal versus, for example live AC line that connects to the photo transistor 4. The lightguide which is a perfect insulator, can literally touch the photo transistor surface (the distance can be several microns thin) with no hazard and no different potentials issue to be concerned with.

Figure 2B:
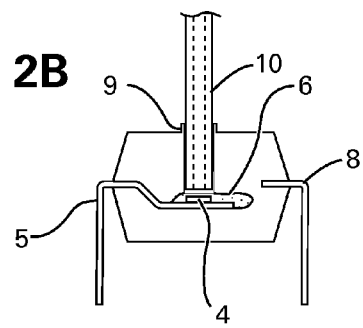

It is also important to note that the terminals 8 shown in FIGS. 2A and 2B are shown non connected, such as for mechanical support only, they are not involved in the electrical or optical communications, nor with power or voltage potentials. The terminals 8 can be an extension of the output terminals, having as per the example above live AC potentials, this will give all the terminals the same AC potential.

Figure 3A:
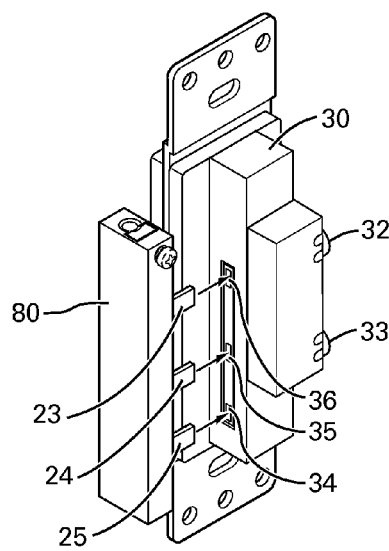
FIGS. 3A~3C are perspective views of a lightguide coupler-OCMOSFET attachment to a typical mechanical AC switch and their combined assembly of a preferred embodiment of the present invention.
Figure 3B:
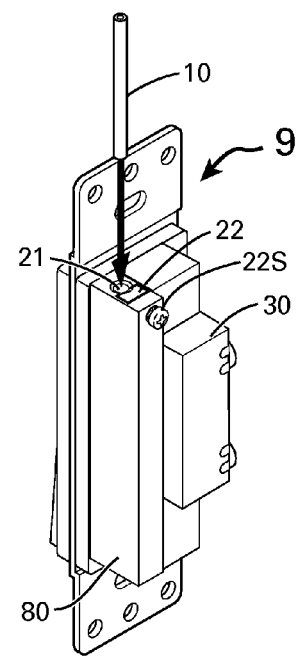
Figure 3C:
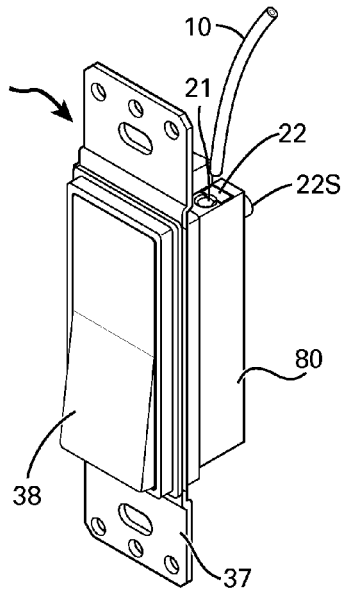

FIGS. 3A, 3B and 3C illustrate the joining of a lightguide coupler-SPDT OCMOSFET switch 80 with a commonly used manual SPDT switch 30. FIG. 3A shows the pins and sockets connecting the lightguide coupler-SPDT OCMOSFET, wherein pin 23 represents traveler 2 line, pin 24 represents traveler 1 line and pin 25 is the live AC line. The three pin and the matching sockets 34, 35 and 36 are also shown in FIG. 4C or 5C. FIG. 5C fully explains the electrical circuits and the connections between the lightguide coupler 80, the switch 30, the live terminal 32 and the load terminal 33 also shown in FIG. 3A.

The combined mechanical switch in FIG. 3B (rear view) shows the access 21 for the lightguide or optical fiber 10 with a built-in holder facility comprising a tongue 22 and a tightening screw 22S to hold the lightguide into position. FIG. 3C (front view) shows the access 21 for the lightguide or the optical fiber 10, the tongue 22 and the screw 22S, the mechanical switch holder 37 and the switch key lever 38. FIGS. 3B and 3C clearly demonstrate the simplicity and the ease that such a combined switch assembly 90 offer for connecting and installing it into a standard electrical box.

The term built-in holder hereafter refers to a part or portion or area of a structure for holding and fastening the lightguide or the optical fiber to the optical access for optically linking the lightguide with the photo elements. This is in contrast to the term attachable holder that can be a snap-on plug and/or at least one structure that is or are separate, to be attached or used for attaching the lightguide to the lightguide coupler body for installing the optical link between the lightguide cable and the photo elements through the optical access.

Figure 4A:
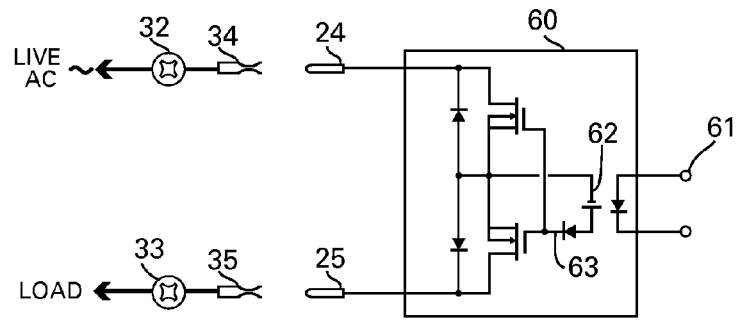
FIGS. 4A~4C are electrical drawings of an AC or DC switching OCMOSFET, the connections of the normally closed, normally open and the combined OCMOSFETs in SPDT setup for operating power switches disclosed in the pending US applications.

Shown in FIG. 4A is a well known OCMOSFET 60 (Optocoupled MOSFET) normally off (non conductive) switching circuit for switching AC or DC appliances on-off, including appliances such as light fixtures. The OCMOSFET switch 60 of FIG. 4A is a standard well known on-off switch incorporating photovoltaic cell 62 for charging the gate capacitors (not shown) with a gate source voltage and switching on the MOSFET to conduct when the LED 61 is lit. The OCMOSFET 60 can be termed a single pole-single throw (SPST) switch that replaces the commonly used mechanical electrical switches, such as lever actuated spring contacts for making or breaking the electric circuit carrying AC or DC current to the appliance.

Figure 4B:
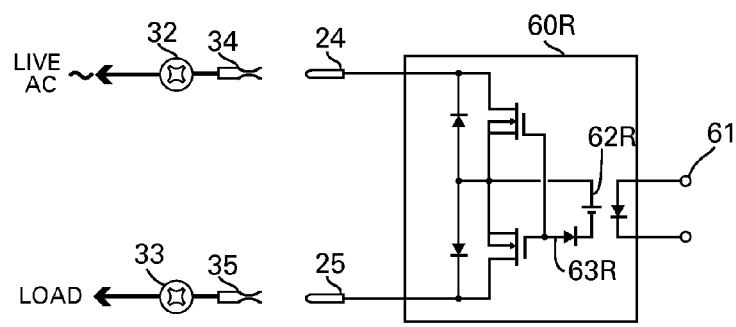
Figure 4C:
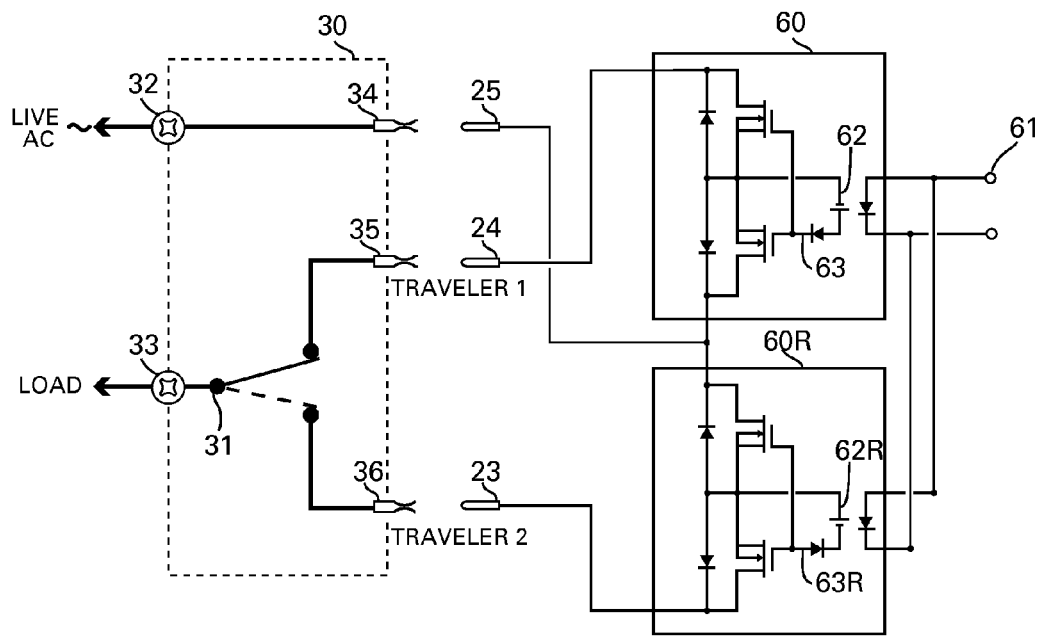

The OCMOSFET 60R of FIG. 4B is similar to the circuit of FIG. 4A with the exception that the MOSFET is normally on (conductive) and the photovoltaic cell 62R is reversibly connected for charging the capacitance of the gate of the OCMOSFET with a biased reverse gate source voltage switching the OCMOSFET off and cutting the current flow through the FET when the LED 61 is lit and illuminates the photovoltaic cell 62R.

The remotely operated switches used for home automation as disclosed in the pending US applications are in fact an SPDT (Single Pole Double Throw) electronic switches using triacs. The combination of SPDT electronic switch along with SPDT mechanical switch is needed to ensure the making or breaking of the AC current fed to an AC appliance by both, a direct mechanical switching and a remote controlled switching. The combined normally open and normally closed OCMOSFET switches of FIG. 4C provide for such SPDT arrangement.

The switching circuit of FIG. 4C connects the two combined OCMOSFET switches via two traveler contacts 24 and 23 to the shown mechanical SPDT switch 30. When the two LEDs 61 are lit via power on (or off) command, the OCMOSFET 60 switches on to conduct, as explained above and the OCMOSFET 60R switches off by the negative charge of the reversed photovoltaic cell 62R. With this circuit arrangement the two combined OCMOSFETs 60 and 60R form a perfect SPDT electronic switch. However the OCMOSFETs 60 and 60R are operated by a transmitter 61 of the photocoupler device, having two input terminals for the on-off switching signals. Such terminals for connections to a low voltage control line cannot be implemented into electrical wall boxes, or along with AC power line and connections. Therefore the OCMOSFETs 60 and 60R cannot be used for such combination with a manual AC power switch 30.

The lightguide coupler-OCMOSFET switches 70, 70R and 80 shown in FIGS. 5A, 5B and 5C can be attached to and combined with the power switch 30 of FIG. 3C, to form a manual-remote AC or DC power switch 90.

Instead of the LEDs 61 that lit the photovoltaic cells 62 and 62R shown in FIGS. 4A, 4B and 4C, the lightguide or optical fiber 10 of FIGS. 5A, 5B and 5C lits the photovoltaic cells, thereby charging the gate capacitors as explained above for switching on or off the OCMOSFETs 70 or 70R. The OCMOSFET 80 is a combined SPDT circuit of a solid state package having dual OCMOSFETs shown with dual photovoltaic cells 62 and 62R, both optically centered toward the attached lightguide 10. By this arrangement it becomes clear that the combination switch circuit 90 shown in FIG. 5C that include the mechanical SPDT switch 30 can be simply connected, as shown in FIGS. 3A, 3B and 3C, by two only power wires AC mains 32, and load 33, plus the lightguide or optical fiber 10.

The three terminals 23, 24 and 25 of the lightguide coupler 80 match the three connectors 34 for the hot line or source, 35 for traveler 1 and 36 for traveler 2, completing the whole interconnections and the electrical connection, as simple as illustrated in FIGS. 3A, 3B and 3C.

Even though the connector 32 shown in FIG. 5C is connected to the live AC and the switch pole terminal 33 to a load, the live AC or a hot line and the load can be reversed. Therefore, the references to a term live AC, hot line, AC mains and/or load hereafter and in the claims to the switch pole (33) and to the terminals (25, 34 and the link to the switch terminal 32) are interchangeable, wherein a term live AC, AC mains, or hot line can be read as load and vice versa.

The OCMOSFET 70 and 70R of FIGS. 5A and 5B can be connected to an AC hot line 32, to a load 33 and to a lightguide 10 in a similar simple structure and be remotely controlled. Even though such setup does not provide the parallel manual switching capabilities offered by the switches setup 90 of FIG. 5C, the OCMOSFETs 70 and 70R shown in FIGS. 5A and 5B are a perfect remotely controlled power switches, operated via a lightguide of the present invention.

Figure 6A:
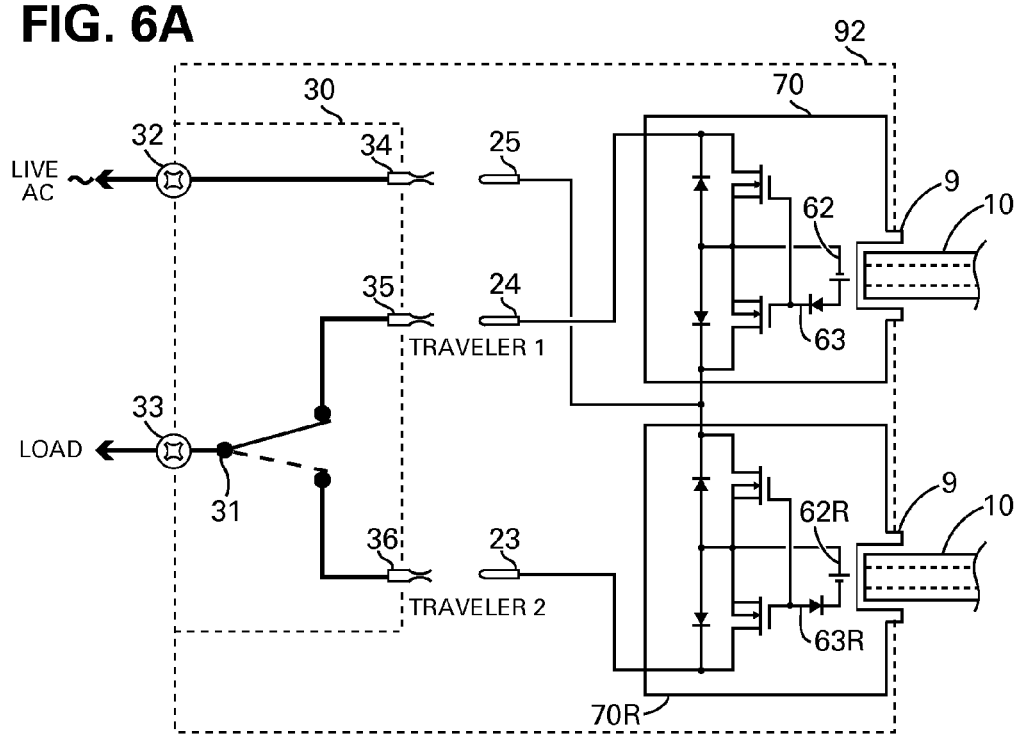
FIGS. 6A and 6B are electrical drawings of a combined SPDT manual switch with two OCMOSFET normally open and normally closed switches operated via two lightguides and a single lightguide via a prism or lens.

FIG. 6A illustrates the assembling 92 of the mechanical SPDT switch 30 with two separate OCMOSFET, a normally close type 70 and a normally open type 70R types that are controlled via dual guidelights 10. In this arrangement the two guidelights 10 must be fed with simultaneously lit optical signals, such as two LEDs (not shown) connected in parallel and are lit together. It is similarly possible to assemble two normally open OCMOSFET switches 70 or two normally closed OCMOSFET switches 70R and operate the combined SPDT OCMOSFET switch via two LEDs (not shown) and two lightguides 10 by lighting alternately, wherein when one LED is lit the other is switched off and vice versa.

Figure 6B:
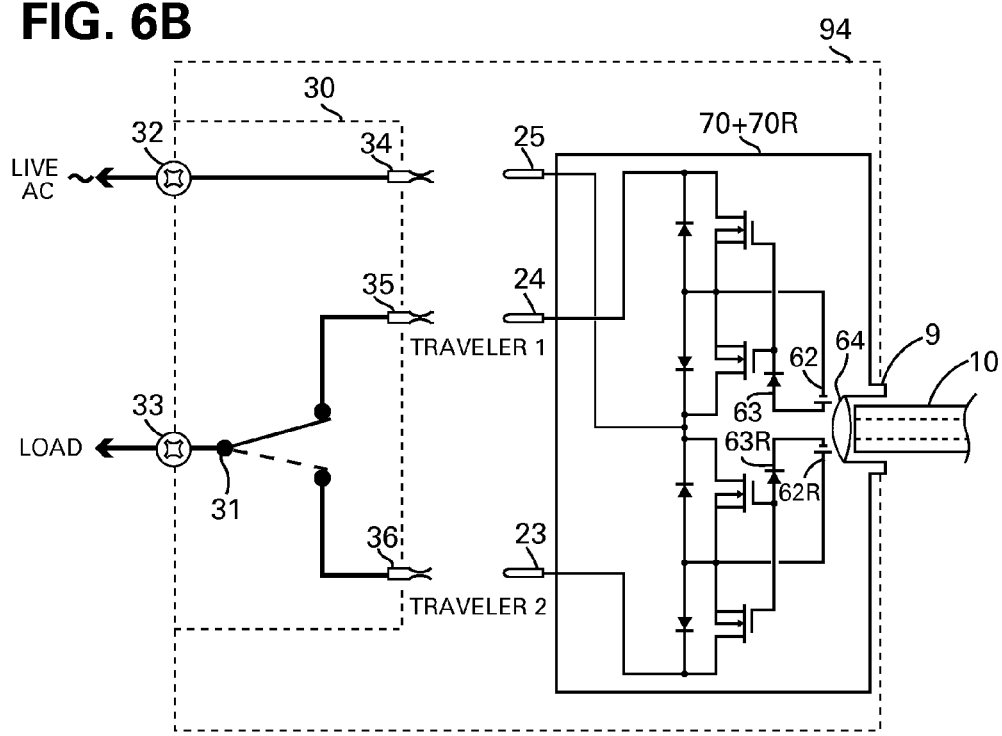

Another combination 94 of the two OCMOSFET switches 70 and 70R with the mechanical SPDT switch 30 is shown in FIG. 6B. In this setup the photovoltaic cells 62 and 62R of each OCMOSFET are positioned such that a single lightguide 10 can direct the control signal to the two individual packages 70 or 70R via an optical lens 64 or prism (not shown) within the optical access 9.

From the above it should become clear that an individual OCMOSFET switches, normally open or normally closed shown in FIG. 5A and FIG. 5B can be operated remotely via a lightguide 10 and that the combined semiconductor package 80 shown in FIG. 5C can be operated in SPDT setup via a single lightguide cable 10. It is also clear that the two individual OCMOSFET switches 70 and 70R packages can be combined with the manual switch 30 and operated via two lightguides 10 as shown in FIG. 6A and via a single lightguide 10 shown in FIG. 6B.

As explained above, the combination of remotely operated SPDT OCMOSFET switch with an SPDT mechanical switch with no current sensing information may cause confusion. Manual switch does not generate information or data to which traveler terminal (1 or 2) it is switched to, and therefore it is not possible to identify the actual on-off state of the connected appliance. Without such current drain or state information the remote controller is not updated and it cannot positively switch the appliance on or off.

For this reason it is necessary to introduce a current sensor to the live AC line for feeding the controller with returned data via the lightguide 10. The current sensors 27 shown in FIGS. 7A and 67 of FIG. 7B can be the AC current sensors by using hall sensors to detect magnetic fields generated by a current through a power wire or by induction explained in the referenced patent applications, or other current sensors, for outputting current drain data or signal to the LEDs 26 of FIGS. 7A and 66 of FIG. 7B for transmitting optical status signal to the controller.

Figure 7A:
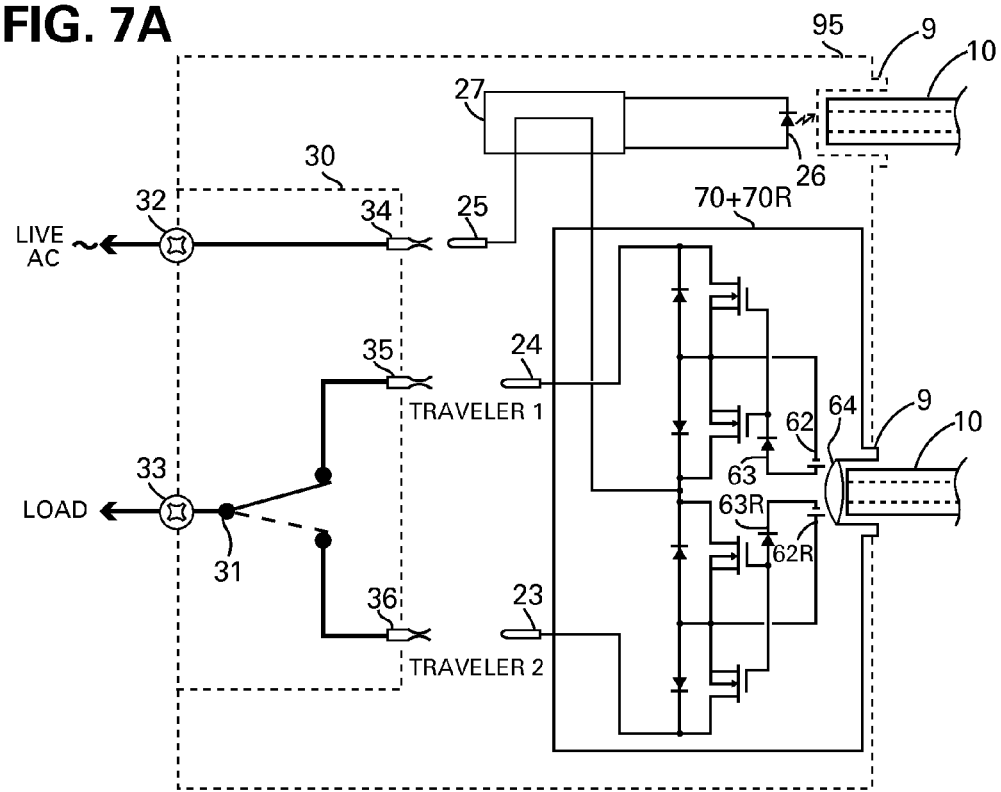
FIGS. 7A and 7B are a version of the electrical drawings of the circuit shown in FIG. 6B with the addition of current sensor and LED for propagating current drain data via additional lightguide or through the same single lightguide and a lens.
Figure 7B:
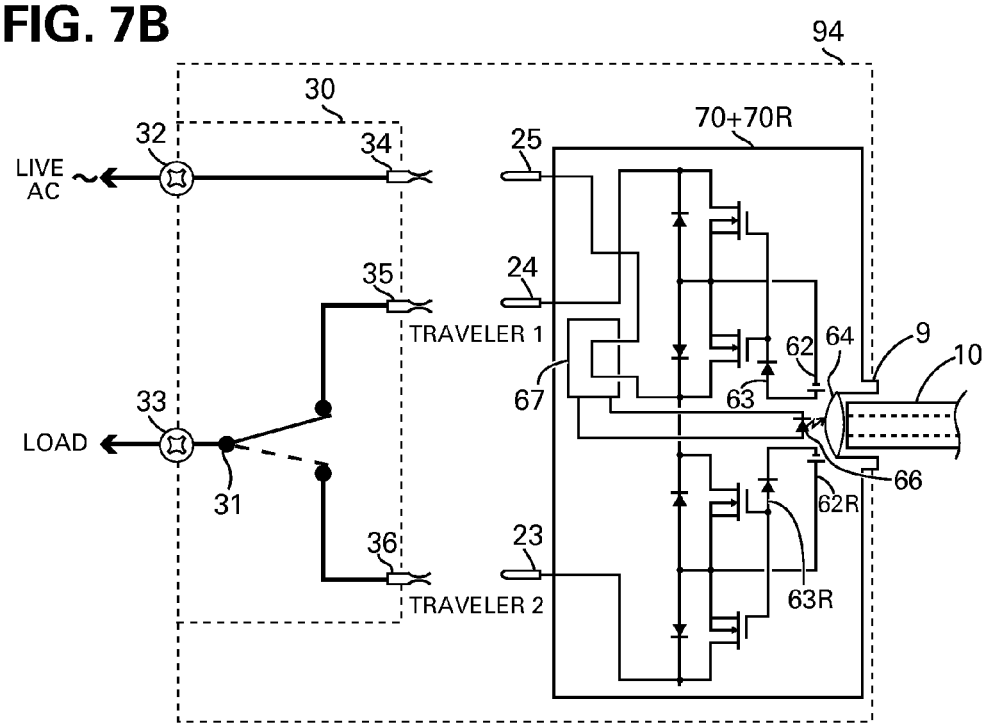

The LED 26 of FIG. 7A transmits to a controller (not shown) the current state via a dedicated one way (returned data) lightguide 10, while the LED 66 of FIG. 7B transmit its current state signal via the lens 64 to the lightguide 10 that propagates two way signals.

The current sensor and the LED for transmitting current state can be a structured semiconductor circuit within each of the OCMOSFET switch, for example the LED 66 of FIG. 7B can be structured to a physical position within the optical access and be in an optical line with the lightguides. Two LEDs similar to the LED 66 can be positioned within the access and be in line with the access and the lightguide when the current sensor is an integrated part of the semiconductor structure of each of the combined OCMOSFETs 70+70R. Same applies to the SPDT OCMOSFET 80 of FIG. 5C. With such arrangement it is obvious that the entire SPDT OCMOSFET including a current sensor and the current state LED transmitter can be packaged into an integrated circuit 80 that can be joint, plugged into or attached to a manual switch 30 as shown in FIGS. 3A, 3B, and 3C or be constructed into a manual switch as shown in FIGS. 12A~12F and be operated manually and remotely in parallel without error.

Instead of the lens 64 a prism, such as half mirror structure, or polarized filter or filters with a given optical band or specific wavelength optical filters can be used. Similarly a different wavelength transmitters can be used to differentiate the optical transmitting signal from the receiving optical signals.

There are many well known different methods to direct, disperse and filter given optical transmission within a given band and/or a given specific wavelength and any of these methods and techniques can be applied and structured into a packaged OCMOSFET switches for propagating two way signals via single lightguide. The shown lens 64 can be a molded plastic or silicon structure embedded in the semiconductor package, such that a simple plug-in SPDT OCMOSFET package can be constructed for attachment to a manual SPDT switch, or an SPST OCMOSFET that is connected individually to the power and the load lines, while transmitting to a controller its current status and receiving on-off commands via a single lightguide.

Other switching devices can be packaged and used with the lightguide coupler of the present invention, including well known transistors, thyristors, diacs and triacs, in many configurations. The triacs switching circuits are fully explained in the U.S. patent application Ser. No. 12/236,656, which are incorporated herein by reference. Though the circuits are shown in a block diagram for assembling different components into an electronic switch or a dimmer, the triac circuit is a well known circuit that is operated by a zero crossing trigger, commonly fed from a diac. Such diacs and triacs are well known to be included in photocoupler packages and can be similarly included in the lightguide coupler of the present invention.

Similar AC or DC switching circuit can use a well known thyristor that is triggered through its gates, which can be fed from a photovoltaic cell included within the semiconductor structure of the lightguide coupler of the present invention. The same will apply to optical transistors operating in Darlington and other power circuits, for switching DC power lines on-off and/or for controlling the current and the load.

The circuits for the triacs, diacs, thyristors and transistors are not shown, but all are very well known. The disclosure of the MOSFET switches, such as the preferred embodiment of this invention clearly demonstrate the extent to which this invention can be applied to other power switching devices.

The terms lightguide and optical fiber referred to above and hereafter are similar or one of the same. Lightguides and optical fibers propagate light by total internal reflection based on the principles of light propagation and the propagation calculations thereof apply to both terms. In practice however the terms are used for different cable structure, materials and thickness or the diameter of the fiber core and its cladding. Therefore, even though the two terms are repeated above and hereafter as such, the term "optical fibers" above and hereafter and in the claims, refer to "lightguides" and to cables known as "Plastic Optical Fiber" (POF) and/or to optical fiber cables having core diameter of 250 μm (0.25 mm/0.01 inch) or larger.

Optical fibers used for high speed communications ever long distances and around the globe consist of three types, step index fiber, graded index fiber and single mode. The core diameter of the step index fiber is 200 μm, it can be used in low speed communication and over short distances of few hundred meters and it is rarely used currently. The popular fibers are the multi mode cables or the graded index fiber, having core diameter of 50 μm or 64 μm, even though some with thicker core diameter of 100 μm are available. The multi mode fibers are used for distances of up to 1 km or 2 km, but in practice they are used in shorter distances below 1 km.

The fiber used for high speed communications is the single mode fiber having core diameter of 8 μm (less than 10 μm) enabling the propagation of optical signals over long distances of tens and hundreds kilometers.

While multi mode fiber use LEDs for generating optical signals the single mode fiber uses only higher costs lasers for its optical signal generation. Moreover, the very thin cores of both the multi mode and the single mode fiber require high precision fiber terminations and connectors, all of which are costly and time consuming to fit during installation, wiring and assembling.

Another important item of the multi mode and single mode fiber is that the amount of light they propagate is very small because of the microns (micrometer) size of the fiber core. For this same reason the multi mode and single mode fibers require highly sensitive and costly receiving elements such as the known high-speed pin diodes with transimpedance amplifiers that may be packaged together into optical transimpedance amplifiers packages. Similarly LEDs and lasers are coupled (bonded or mechanically attached) to a optical fiber (pigtail) for improving the light passing accuracy. Such fiber coupled laser packages may include coolers and/or other devices and circuits.

The thicker core lightguide also termed plastic optical fiber (POF) are used extensively for lighting in medical equipment, such as invasive and non invasive fiber scopes for taking organ pictures. The thicker optical fibers belong to the step index fiber types, having higher attenuations, of up to 0.5 dB/m which limits the use of lightguides to a practical length of 100 m for slow speed, 50 to 60 m for medium speed (300 kb/s) and to 10~20 m for high speed communications.

The larger core diameter however propagates more light and therefore can be used with low cost photo resistors, photo diodes, photo diacs, photo transistors and photovoltaic cells. Because of the large diameter of the core (up to 2.0 mm or more/0.1 inch) the accuracies of aligning the lightguide to the receiver's photo sensitive surface does not require the micron accuracies that are critical for the single mode or the multi mode optical fiber connectors. Same applies to the LEDs (transmitters) that feed the optical signal into the lightguides. The mating of the LED with a lightguide does not require severe accuracies either, micron accuracies are not critical for the position of the lightguides to access the light emitted by the LEDs.

The thicker core lightguides and plastic optical fibers propagate more light onto the receivers having larger optical photo sensors surfaces and therefore do not require the super high sensitivity and high cost receivers and transmitters used with multi mode and single mode optical fibers. Same applies to the connectors, lightguides do not require highly accurate connectors, the lightguides can be attached to the semiconductor packages of the present invention without connectors altogether, or with a simple mechanical Snap-On connector or cable holder for locking the cable end to the optical access of the packaged semiconductor. Further, multicore lightguides are available in flat and round cables that can be introduced into multi input, output and two way accesses of lightguide couplers, by a simple mechanical attachment, requiring no "multi pin" connectors and similar.

Another advantage is the core lightguide's plastic material, PMMA or perfluorinated polymers, a softer material that can be cut by a sharp knife or guillotine style cutter, requiring no further lapping or polishing. The soft core provide for sharp bending of lightguides, into radiuses as small as 5 mm (0.2 inch), which is very useful in apartments and buildings with the many partitions and walls forcing the installers to bend the cables repeatedly throughout. This is in clear contrast to the silica, or other glass materials based optical fibers that are harder, require lapping and polishing of the cable ends, the fitting of expensive accurate connectors and require softer bending into radiuses no smaller than 50 mm (2 inch) that pose no difficulties in long stretched communication networks, but it will be literally impossible to connect multi mode or single mode fiber optic cables to switches inside crowded, standard wall electrical boxes.

Further, lightguides and plastic optical fibers are designed to propagate visual light in contrast to the optical fibers that propagate IR signals having wavelengths in the 850 nm, 1,350 nm and over 1,550 nm bands, none of which are visible. Even though lightguides propagate wide optical signals spectrum (from UV to IR) the lightguide's peak propagation, or the least attenuated wavelength is the 650 nm or the red light region. This enables the use of low cost high brightness red LED elements as the transmitters for transmitting optical control and communication signals to and from a controller, to and from a control signal converter and between lightguide coupler packaged semiconductors.

From the above descriptions it should be clear that the use of lightguides and plastic optical fiber or optical fibers having cores larger than 250 μm in homes, residences, office and small workshops and factories with cable stretches, in walls or along the walls, that are less than 100 m (330 feet) long for low speed communications, is totally different from the use of the multi mode and the single mode optical fibers that are stretched over long distances for high speed communications, involving precision and high cost throughout, and could not work with the lightguide coupler of the present invention.

As explained above the optical networks connecting two or more lightguide couplers of the present invention are limited in length, with the communication speed being the main limiting factor. The lightguides are specified by their attenuations per one meter length (dB/m) and on the basis of the core diameter (mm). Larger core diameter passes more light and offers smaller attenuation, but thicker core (enhanced step index) limits the frequency or the communication speed, hence the balancing between attenuation, communication speed and the stretches length of the lightguide.

Further, even though short distances can be optically connected at a low cost, the use of structured optical elements such as prism including half mirrors, filters and lenses to propagate two way optical signals via single lightguide, reduces the cable cost, but also the propagates light by up to 50% or more, thereby the prism and its associated optical elements further reduce the lightguide network stretches length.

For this reason it may be preferable to use prisms and a single lightguide for controlling electrical switches and appliances that require low speed communications. Limit high speed two way communications for short, up to 16 meter (50 ft) networks or use multicore lightguide couplers and cables as discussed below.

FIG. 8A shows an exploded view and the internal structure of a lightguide coupler 100 of a preferred embodiment along with the holders 105 and 110. The coupler 100 is dual two way coupler comprising two optical transmitters such as LED 3A and 3B and two optical receivers such as photo diode or photo transistor 4A and 4B. The left side pairs, the transmitter 3A and the receiver 4A are shown connected to the left pins 5A while the right side pair 3B and 4B are connected to the right pins 5B. Only three pin 5A and 5B on each side are shown in FIGS. 8A~8C, but any number of pins can be introduced, such as 8 or 10 pins on each side, known as DIP (dual in line) or single line pin can be introduced at the rear or the front, or on both the rear and the front. Alternatively the pins can be introduced on the rear of the package such as shown in FIG. 2A. The number of pins should accommodate the needed contacts or the connections for the structured semiconductor circuit 101 shown inside the coupler 100.

Even though the transmitters 3A and 3B and the receivers 4A and 4B are shown connected to the pins 5A and 5B, when the transmitters are driven by signals from an internal drivers and/or the receivers generated signals are fed to a given internal packaged circuits, the transmitter or the receiver or both may be internally connected to the semiconductor packaged circuits 101 and not necessarily to the pins. The optical transmitters and or the receivers however can be connected to both the internal circuits and the pins and/or the transmitter and the receiver could be part of the internal semiconductor structured circuit itself and require no separate electrical connection altogether.

The structured semiconductor circuit 101 is a very well known integrated semiconductor structure and it can be any known electrical packaged circuit comprising for example basic circuits such as single device circuit namely a diode, a diac, a thyristor, a transistor, a FET, a MOSFET and a switch and/or a complex circuit such as a central processing unit (CPU), a digital signal processor (DSP), a current sensor, a current data processor, an amplifier, a driver, a buffer, a distributor, a compensator, a limiter, a comparator, a filter, a modulator, a demodulator, an encoder, a decoder, a timer, an oscillator, a clock, a mixer, an RF transmitter, an RF receiver, an RF transceiver, a hub, a router and combinations thereof and/or other known circuit and/or any other circuit that will be developed in the future for coupling it through at least one lightguide or optical fiber of the present invention.

FIG. 8A further shows the four accesses 9 for providing optical links to the optical transmitter 3A and 3B and the receivers 4A and 4B, a mechanical bar 103 for attaching the holder 105 to the lightguide coupler 100 using a screw 102. The holder 105 is an attachable holder in contrast to the holder 22 shown in FIGS. 3B and 3C that is a built-in holder, structured within the lightguide coupler package itself, together with the access 21.

The attachable holder 105 is a separate structure, to be attached to the lightguide coupler 100. The holder 105 of FIG. 8A is shown with four rear round concaves 106R that fit the protruding rings or convexes of the accesses 9 for aligning the four accesses with the four inlets 106 and for attaching the lightguides 10 with the optical transmitters and receivers 3A, 3B, 4A and 4B. Even though the concaves 106R are shown as indentation within the holder 105 and the protruding rings are shown protruding from the lightguide coupler 101, the rings and the concaves can be reversed or may not be necessary at all. Small one or two structured pins inserted into positioning holes in either part can be as accurate. Similarly a frame or border guides can be used instead to position accurately the holder against the packaged lightguide coupler. There are many ways to join or attach the holder 105 to the lightguide coupler 101, including plurality of screws or materials such as adhesives.

The four front surfaces 106F of the four inlets 106 are concaved cones for locking the lightguides 10 into place using circled vises 111. Shown in FIG. 8B are the rear side of the two holders 110 that are termed also as the locking plugs 110, each with two protruding vises 111 that are shaped to vise and lock the lightguide or the optical fiber 10 against the concaved cones 106F. The front view of the holders or the locking plugs 110 shown in FIG. 8A and the rear view shown in FIG. 8B represent the simplicity of attaching the lightguides 10 by the locking plugs or holder 110 to the accesses 9 using the screws 112 that fasten the locking plugs 110 to the studs 107 of the holder 105.

FIG. 8C shows a cross sectional view of the lightguide coupler 100 attached to the holder 105 by the screw 112 with the rear concaves of the inlets 106R containing the protruding rings 9 of the accesses as explained above. The holder or the locking plug 110, the screw 112 and the lightguides 10 are shown ready to be inserted. Prior to attaching the plug 110 the vises 111 are lose and the lightguides 10 can be freely inserted. FIG. 8D shows the lightguides and the holder 110 attached and fastened by the screw 112 with the lightguides fastened by the vises 111 that are pressured against the concaved cones 106F. The lightguides 10 are pushed all the way through, literally touching (through a thin protection) the optical transmitter 3 surface and the optical receiver 4 surface, into a perfect optical link.

The shown lightguide coupler 100 is structured with each optical pair, such as 3A and 4A are vertically positioned with the optical output access from the transmitter 3A is the top access and the input optical access to the receiver 4A is the bottom access. Such setup or positioning can be reversed, similarly, the input and output pairs can be structured and positioned horizontally to the left and right of the lightguide coupler 100. Such vertical or horizontal positioning enables the combining of many lightguide couplers into an in-out optical accesses arrays as shown in FIG. 9B, providing for simple and convenient construction of horizontal or vertical optical hubs, routers, controllers and distributors.

FIG. 9A shows the lightguide coupler 100 with the holders 105 and 110 and with the four lightguides 10 fastened to position by the screws 112. Even though the practical thickness or diameter of the lightguides or the optical fiber cables 10 are small, such as 2~3 mm (0.1 inch) and the entire practical sizes of the lightguide 100 with the holder 105 can be some 20 mm wide and 22 mm height (less than 1 inch) are small, the miniaturization trend in components sizes should be addressed as well.

Lightguides and optical fibers are produced in different multicore cable combinations, or can be combined into a trimmed and/or shaped or bundled multicore setup. Different hand tools such as a guillotine cutter, cable trimmer and shaper (not shown) are provided for improved cutting, truncating, trimming, shaping and bundling the softer lightguides and the stiffer fiber optic cables. Multicore structure lightguides, such as two, three, four, six cores and more are produced and available, enabling the design and the manufacture of smaller size multicore lightguides holders and larger scale lightguide couplers for multi one way optical signal distribution and control and/or for multi two way application and combinations thereof.

FIG. 9C shows such dual core lightguide cable 12 with a holder 205 attached to a lightguide coupler 200 that is smaller in size and provide for dual in-out optical pairs communications. The pins 205 are a surface mount solder contacts, with the holders and the two locking plugs 210 are shorter, enabling to limit the height of assembly and simplify the connections by reducing the lightguide termination and attachment processes by half.

FIG. 9D shows a multicore lightguide cable 14 with four cores for dual in-out, four out, or four in optical signal propagations through the attachment to a lightcoupler 400 and a holder 405, which are smaller in their width and height dimensions. Here too, the electrical contacts 205 are the surface solder terminals or contacts as used for a surface mount ICs or other packages. Both inlets 206 and 406 of the holders 205 and 405 are structured into smaller pitches commensurate with the dual cores and the four core pitches. The pitches and the inlets can be constructed to correspond or commensurate with other shapes, sizes and pitches of multicore lightguide cables, such as flat or round cables and other given shapes. Same applies to the lightguide coupler 200 and 400 construction, they can be made to commensurate with the pitches, sizes and shapes of the given multicore lightguide cables, or provide a standard sizes for the lightguide manufacturers to follow.

The holder 210 and 410 with the vises 211 and 411 of FIGS. 9C and 9D are similar to the vises 111 shown in FIG. 8A~8D, but are sized to lock the dual core 12 and four core 14 lightguide cables, and so are the front concaved cones 206F and 406F, with the concaved cones are not full circles. The screws 112 are shown to fasten the holders or the locking plugs 210 and 410 onto the studs 207 and 407, however instead of the screws many types of locking hooks, bars and other locking structures can be used. FIGS. 10A and 10B show such a simple self-lock or snap-on plug 18. The U.S. patent application Ser. No. 12/236,656 discloses other fastening and locking facilities for the lightguides, all of which are incorporated herein by reference.

FIG. 10A shows a combined electrical and optical circuit diagram of a lightguide coupler-data receiver 120 for receiving an optical current state and drain signals and for converting the signals into electrical signal for propagating the converted signals via a twisted pair network 128 of a residence automation controller, including video interphone monitor, shopping terminal or a dedicated controller. Operating and controlling electrical appliances through AC or DC outlets mandates the identifying of the given electrical outlet and the connected electrical appliance. Such database cannot be created at the time the building is designed, nor when the electrical system is put in place because residents move appliances around and change at random the appliance's electrical connections. On the other hand it is very costly to install current sensors in every electrical outlet, moreover it will be very complex to update the automation database with random connections of different appliances in every room or zone of the residence or office or factory.

For the above reason it will be cheaper to install lightguide coupler-current data receiver having plurality of optical inputs, interfaced with the low voltage network 128 of the home automation system for propagating the current drain and/or the appliance's state to the automation controller with the low voltage network feeding power to the current data receiver 120 for its operation. The current data receiver 120 shown in FIG. 10A includes a lightguide coupler 121 with a single optical receiver 4 and a single access 141 for providing optical link to a single lightguide 10. The lightguide coupler of the current data receivers 120U and 120E of FIGS. 10B and 10C however are shown with four input receivers, structured similar to the coupler 100 of FIG. 8A. The coupler 121 of the current data receiver 120 includes a current data processor, or a CPU, or a DSP and a memory 122 for processing the received data and communicating the appliance's state and/or the current drain data through the low voltage network or communication line 128. The memory of the CPU 122 is used to store data identifying the room or zone of the residence, office or workshop and the particulars or details of the appliance or the load that drains the current. The identification data can be loaded from an optical transmitter 500 through the access 141 as shown in FIG. 10D, directly to the CPU, or from the home automation controller via the low voltage communication line 128. Alternatively, such data can be set via digital rotary switches as disclosed in the pending US patent applications.

The shown low voltage network 128 carries also power to its connected network devices and is connected to the lightguide coupler 121 via a DC extractor 125 for extracting the power and feeding the extracted power to the lightguide coupler 121 via lines 128P. The details of the extracting circuit 125 are disclosed in the US patent pending applications.

FIG. 10B shows the US standard electrical outlets 142, the electrical wall boxes 146 and the AC plug 149 for powering a television set 148. The AC current sensing adapter 140 includes a lightguide coupler and current state transmitter 3, structured similarly to the coupler shown in FIG. 8A but with a single transmitter. The current sensor can be a magnetic hall sensor or an induction transformer or coil disclosed in the pending US patent applications or a semiconductor structure of the coupler circuit such as 101 of FIG. 8A. The transmitter or the LED 3 of the coupler is optically linked via the access 141 shown in FIG. 10B. The current sensor adapter extends serially the power outlet 142 to 147 and when the television set is switched on the current sensing adapter will detect the current drain and will lit the LED on or will generate a data with specific current drain information.

The lightguide cable 10 is attached to the current sensing adapter via the access 141 using the holder 18, which is a snap-on plug to lock and fasten the lightguide 10 to the access 141. The other end of the lightguide 10 is attached to one of the four accesses of the current data receiver 120U via the holder or fastening plug 110 explained above, by tightening the screw 112. This completes the optical link between the current sensing adapter 140 and the current data receiver 120U.

The exact same applies to the European standard electrical system shown in FIG. 10C. The load or the appliance shown is a space heater 158, such appliance requires the processing of further data. For example, when the heater 158 is switched on and have reached a preset temperature, a thermostat will cut the power and the system will only be fed with no current which may be a misleading information, because the heater may be identified as being in off state while the heater is switched on. For this reason the current data receiver must be updated with the on-off commands whenever on or off commands are propagated to the heater. By such data the system will identify the no current to be the result of a thermostat activity.

Another difference in FIG. 10C are the four accesses 141 of the current state receiver 120E, which all can be attached by the snap-on plug 18 as an holder for each lightguide cable 10. The other differences are all related to the standard European wall outlet 152, the current sensor adapter 150, the AC plug 159 and the electrical wall boxes 156, which all are shown to be the European standard types, while those of FIG. 10B are the US standard type.

From the above it should be clear that the present invention for lightguide coupler can be used in combination with current sensing and current data propagation and offer most economical solutions to homes, residences, offices and factories. The lightguide coupler can be used for local communication networks for home automation controls and provide the low cost devices needed to monitor and control the different electrical appliances.

The optical transmitter 500 shown in FIG. 10D is similar to an IR remote control that is used for the home automation system and is shown attached to a lightguide adapter 510 for feeding optical data, such as room or zone address or number, data identifying particulars such as the type of the appliance including the particulars of its current drain. Such data is fed when the current sensing adapter is installed and before its lightguide is attached to the current state receiver 120U or 120E, giving the user or the installer the most simple recording of data, which otherwise is a know-how based process.

Figure 11A:
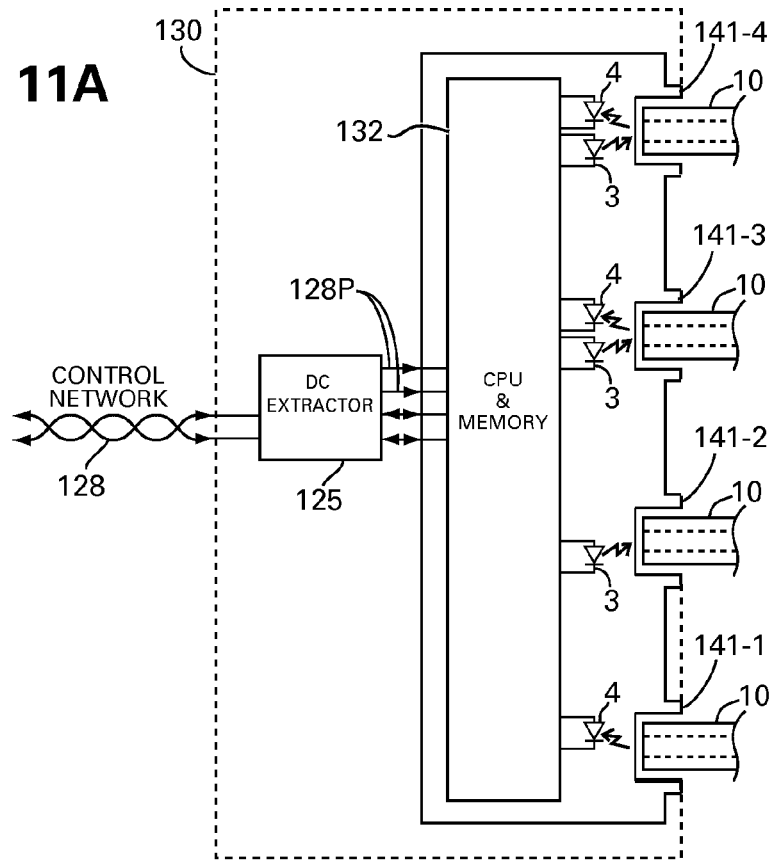
FIG. 11A is electrical block diagram of a lightguide coupler-distributor of the present invention.

The block diagram of FIG. 11A shows a lightguide coupler-distributor 130, an expanded circuit of the lightguide coupler-current data receiver 120 shown in FIG. 10A. The lightguide coupler-distributor 130 includes four optical accesses, 141-1 an optical input for receiving data via the photo diode 4, such as the access 141 shown in FIG. 10A. Access 141-2 is an output for propagating control and commands via the linked lightguide 10 from the optically aligned LED 3 or the transmitter. The accesses 141-3 and 141-4 shown are two way optical accesses for communicating optical signals, each via the receiver 4 and the transmitter 3 having direct two way link through the respective access. The CPU with memory 132 is similar CPU and memory circuit 122 of FIG. 10A with expanded I/O ports for the expanded photo elements or the three receivers 4 and three transmitters 3 shown in FIG. 11A.

The data processor, or CPU, or DSP 132 is connected through the DC extractor 125 to the electrical communication network 128 for communicating with the controller (not shown). The DC extractor extracts the DC from the communication network and powers the CPU 132 via the power lines 128P, same as explained above for the lightguide coupler-current data receiver 120.

It is clear from the above that the data receiver input via access 141-1 can be used for receiving current data from the current sensor adapter 140 or 150 shown in FIGS. 10B and 10C. Similarly it is clear that the particulars of the appliance and its location can be installed or loaded into the memory of the CPU 132 via the transmitter 500 of FIG. 10D, or directly to the CPU, or via the network 128.

The optical output access 141-2 is used for feeding commands and control to appliances incorporating lightguide coupler with receiving only access and with no optical data response to the received command. The shown transmitter 3 of the access 141-2 can be a transmitter that operate upon an optical command signal received by the receiver 4 of the input access 141-1 or the accesses 141-3 and 141-4 or through a command via the network 128. The CPU 132 is programmed to decode the received optical command and control signals and redirect the received signals as addressed, via an I/O driver port, to the respective LED 3 for relaying or transmitting the command to its destination.

The accesses 141-1 and 141-2 can, on the basis of the installed addresses and particulars communicate mutually the two way optical signals via two single core guidelight 10 with the same appliance incorporating two way lightguide coupler or via other optical devices such as disclosed in the US referenced applications.

The two way optical accesses 141-3 and 141-4, shown to have direct optical links with the receivers 4 and the transmitters 3, can include a lens, a prism and/or filters instead. The two way accesses can be optically connected to appliances or to a communication device such as PC via, for example, a USB adapter comprising two way lightguide coupler for exchanging information with the automation controller (not shown) via the lightguide coupler-distributor 130 of FIG. 11A.

Figure 11B:
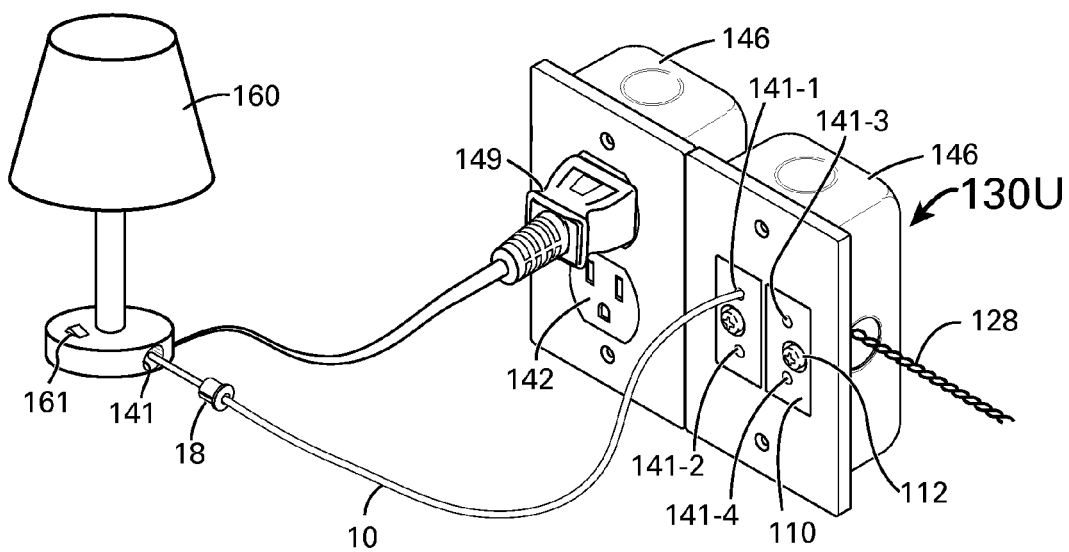
FIG. 11B is a perspective illustration of the interconnecting of the lightguide coupler-distributor with an LED or light fixture of the present invention.

The accesses 141-3 and 141-4 can be linked to different appliances, for example, the light fixture 160 incorporating lightguide coupler-SPDT CMOSFET or triac switch, similar to the switch 70+70R shown in FIG. 7B, which is connected to a manual SPDT switch 161 of the light fixture or the lamp 160 shown in FIG. 11B. The lightguide coupler switch operating the lamp 160 can comprise a dimmer circuit and the lighting element can be, for example, high brightness LED or LED array and its brightness control can be increased or decreased by a pulse width and/or pulse rate, controlled by the CPU 132 of the lightguide coupler-distributor 130 or by the lightguide coupler-switch included of the lamp 160.

Any appliance comprising lightguide coupler with two way optical links including a structured or a connected current sensor can be optically connected with the two way accesses 141-3 or 141-4, for example the TV set 148 and the space heater 158 of FIGS. 10B and 10C, can be controlled and operated through the lightguide coupler-distributor 130 and propagate a return optical current drain data or state signal without the use of the current sensor adapter 140 or 150. Further, the particulars of such appliances and the location of the appliances can be loaded or installed by the optical transmitter 500 to each of the accesses 141-3 and 141-4 individually, in a same or similar process explained above for the current data receiver 120.

FIGS. 12A~12F show a mechanical SPDT switch assembly, jointly structured with the SPDT lightguide coupler unit 210 into a combination of "opto-mechanical" power switch 290. The opto-mechanical switch 290 uses the traveler terminals or contacts 23 and 24, shown in FIGS. 3A~3C as pin contacts 23 and 24 for attachment into socket terminals of the mechanical switch 30 to include also the power interconnecting contact 25 and socket 34. In contrast the contacts 23 and 24 are structured into traveler contacts of the switch itself, while the AC live and load terminals 31 and 24 are structured into the lightguide coupler packaged switch 210.

The switch pole 31 (Load) is attached to the SPDT lightguide coupler switch package 210 in a structure that includes the terminal 33 (Load), transforming the package 210 into the base for the combined switch, comprising all the electrical contacts and terminals needed to join together a mechanical and remotely operated lightguide coupler SPDT switch assembly. The opto-mechanical switch 290 shown in FIG. 12F is a slimmed structure switch, similar to the joint switch 90 shown in FIGS. 3A~3C explained above and detailed in FIGS. 5C, 6B and 7B. Though not shown the combined switch includes also the combined switches 92 and 95 shown in FIGS. 6A and 7A by providing two lightguide accesses 21 for using dual lightguides 10 with the SPDT lightguide coupler packaged 210 as explained above.

FIGS. 12A~12C show three cross sectional views of the combined lightguide coupler SPDT switch assembly 200 with its rocker assembly is shown stopped in FIG. 12A to its bottom position, in its transition state (between its top and bottom stop positions) in FIG. 12B and stopped to its top position in FIG. 12C. The rocker assembly includes the rocker body 201, its center pivot pins 202, the piston holder and guide 203, a hollow piston containing a spiral spring 205 and two top and bottom stop bars 204 to stop the rocker movement at its stopped top or bottom position.

The shown rocker mechanism and operation is a well known structure, used by many manufacturers for their different rocker switches. In the shown structure the piston 205 is pushed inwards into its holder and guide 203, contracting the spiral spring during the rocker movement toward the center position of the seesaw contact assembly 206 when the rocker assembly is switched over from top to bottom or bottom to top. The spring will expand and release its tension by forcing the piston onto the opposite side of the seesaw contact 206 to snap and engage the other traveler contact when the rocker movement and the piston pass the center position of the seesaw contact 206.

The contact assembly 206 is pivoted around the center bars 207 shown in FIGS. 12D and 12E, it is tightly attached to the terminal 31 and it is structured to stop the piston movements from top to bottom or bottom to top by the two vertical arms of a U shape portion 206U of the assembly 206. The center pivot pin 202 of the rocker body 201 and the center bars 207 are supported by holders (not shown) included in the case 230 of the combined switch assembly 290, such that the rocker body 201 and the seesaw terminal 206 are rocking and seesawing around their center pins 202 and bar 207 respectively.

The seesaw contact assembly 206 is shown in its engagement with the top traveler contact 24 when the rocker body 201 is at its bottom stop state. The seesaw contact is shown engaged with the top traveler contact 24 even though the rocker body 201 is in its mid movement position shown in FIG. 12B, maintaining the electrical contact between the terminal 31 (Load) and the traveler contact 24, even though the full force of the spring and piston 205 against the seesaw top side contact is weaken.

The seesaw contact 206 in FIG. 12C is shown flipped or switched over to engage the bottom side traveler terminal 23 when the rocker assembly 201 is stopped in its top position, fully engaged by the force of the release of the contracted spring and the piston 205 movement toward the stop arm 206U, connecting the load terminal 31 to the switched over traveler terminal 23.

FIG. 12D shows the left side 290L of the combined switch assembly and the live AC or DC terminal 32 and contact 34 that is directly structured into the lightguide coupler switch package assembly 210. Also shown in the lightguide access 21, the lightguide locking tongue 22 and the locking screw 22S, that are structured into the case 230 of the combined switch 290. FIG. 12E on the other hand shows the right side of the combined switch 290R. The right side includes the Load terminal 31 and contact 33 for connecting a load wire to the switch. FIG. 12E also shows the assembled heat sink 241 that may be needed for dissipating heat from the SPDT lightguide coupler switch package 210.

The lightguide coupler switch package 210 includes a heat sink surface 213 for attaching heat sink 241 shown in FIGS. 12A~12C, 12E and 12F. Different heat sink types and sizes are needed to dissipate the heat from the semiconductor switch. The heat sink is also used as the metal holder for the combined opto-mechanical switch 290 for assembling the switch to an electrical box (not shown) and for connecting the ground or earth wire in accordance with the electrical codes. Such ground connection 242 is shown in FIG. 12F.

FIG. 12F is an exploded view of the combined switch 290 including the well known front cover 243 and the rocker key lever 244. The rocker body 201 is shown in FIGS. 12A~12F to include circled cutouts 45 for accommodating and locking the pins 44 at the rear end of the rocker key lever 244. By this it becomes clear that the combined switch 290, comprising a mechanical SPDT switch constructed onto the lightguide coupler semiconductor packaged switch can replace the well known power switches and be installed with no hazards and in compliance with the electrical and building codes into electrical boxes and be manually operated via the combined rocker switch and remotely via the residence automation or other dedicated control system, using optical communications via lightguides and/or fiber optic cables.

The combined rocker opto-mechanical switch 290 shown in FIGS. 12A~12F is only an example of the preferred embodiment, however many other type switches can be used instead, including micro switches, toggle switches, rotary switches, slide switches, push switches, pull switches and any other power switches used in residences, offices, business establishments, factories and other facilities, having terminals that can be attached to, plugged into and/or constructed onto the lightguide coupled semiconductor switch package of the present invention.

From all the above it should be obvious that there are many different circuits, connections, features and applications that can be based on the simple, low cost solution for optically connecting appliances with communication devices using the semiconductor lightguide coupler packages of the present invention.

It should be understood, of course, that the foregoing disclosure relates to only a preferred embodiment of the invention and that it is intended to cover all changes and modifications of the example of the invention herein chosen for the purpose of the disclosure, which modifications do not constitute departures from the spirit and scope of the invention.

What is claimed is:

1. A method for coupling an optical signal via at least one optical cable selected from a group comprising lightguide, optical fiber and a combination thereof to a semiconductor circuit contained in a packaged plastic enclosure of an integrated lightguide coupler for monitoring and communicating data pertaining to a current drawn through one of an AC power line and an AC power outlet including one of reporting and controlling the consumed power by an electrical appliance;

said packaged plastic enclosure of said integrated lightguide coupler further contains at least one optical access made of a plastic molded structure, and at least one photo element selected from a group comprising a photo diode, a photovoltaic cell, a photo diac, a photo thyristor, a photo triac, a photo transistor, a photo MOSFET, an LED, a laser and combinations thereof, said at least one photo element being integrated with said semiconductor circuit, and said semiconductor circuit being selected from a group comprising a current sensor, a current data processor and a combination thereof;

said optical access providing for directly attaching and optically linking said at least one optical cable with said at least one photo element, at least one holder selected from a group comprising a structured holder within said enclosure, an attachable holder and a combination thereof for holding a terminated end of said optical cable attached to said access, said method comprising the steps of:
a. terminating said optical cable end by a sharp cut;
b. attaching the terminated end directly to said access;
c. holding the terminated end attached to said access by said holder; and
d. exchanging said optical signal selected from a group comprising transmit, receive and two way communication between said optical cable and said photo element for communicating said data with said circuit.

2. The method for coupling an optical signal to a semiconductor circuit according to claim 1, wherein said optical access is made of a plastic molded structure for directly attaching and optically linking said terminated end with at least two photo elements comprising one receiver and one transmitter contained in said enclosure of said integrated lightguide coupler for exchanging two way optical signals via said at least one optical cable.

3. The method for coupling an optical signal to a semiconductor circuit according to claim 1, wherein said access is made of a plastic molded structure for directly attaching and optically linking said terminated end with at least three photo elements selected from one of a combination comprising one receiver with two transmitters and one transmitter with two receivers contained in said enclosure of said integrated lightguide coupler for exchanging two way optical signals via said at least one optical cable.

4. The method for coupling an optical signal to a semiconductor circuit according to claim 1, wherein said enclosure of said lightguide coupler contains two said optical accesses made of a plastic molded structure for optically linking two terminated ends with at least two photo elements comprising one receiver and one transmitter contained in said enclosure of said integrated lightguide coupler for exchanging two way optical signals via a receive optical link and a transmit optical link;
said accesses are spaced to commensurate with one of an optical cable with dual core and two of said optical cable with a single core each, and wherein said holder and said access are further structured in one of a combination comprising said holder for holding the optical cable with dual core directly attached and optically linked to two said accesses spaced for said dual core and two holders for holding optically two said optical cables each with a single core directly attached and liked to said accesses spaced for two single core optical cables.

5. The method for coupling an optical signal to a semiconductor circuit according to claim 1, wherein said optical access is made of a plastic molded structure for directly attaching and optically linking a plurality of terminated ends of a multicore optical cable with a plurality of photo elements selected from one of a plurality of receivers and a plurality of transmitters contained in said enclosure of said integrated lightguide coupler for propagating a plurality of one way optical signals via said multicore optical cable, and wherein said holder holds said multicore optical cable directly attached to said access for linking each of a plurality of said elements with one core of said multicore.

6. The method for coupling an optical signal to a semiconductor circuit according to claim 1, wherein said enclosure of said integrated lightguide coupler contains a plurality of optical accesses each made of a plastic molded structure for directly attaching and optically linking a plurality of terminated ends of a plurality of said optical cables with a plurality of photo elements selected from one of a plurality of receivers and a plurality of transmitters contained in said enclosure of said integrated lightguide coupler for propagating a plurality of one way optical signals via said plurality of said optical cables each with a single core, and wherein one of a plurality of holders holds one of said plurality of optical cables with a single core directly attached to one of said plurality of accesses.

7. The method for coupling an optical signal to a semiconductor circuit according to claim 1, wherein said optical access is made of a plastic molded structure for directly attaching and optically linking a plurality of terminated ends of multicore optical cable with a plurality of pairs of photo elements contained in said enclosure of said integrated lightguide coupler, each of said pairs comprising one receiver and one transmitter is spaced to commensurate with a multicore optical cable for exchanging two way optical signals via one core of said multicore, and wherein said holder holds said multicore optical cable directly attached to said access for linking at least two said pairs with at least two cores of said multicore.

8. The method for coupling an optical signal to a semiconductor circuit according to claim 1, wherein said enclosure of said integrated lightguide coupler contains a plurality of optical accesses each made of a plastic molded structure for directly attaching and optically linking one said terminated end with one pair of a plurality of pairs of photo elements contained in said enclosure of said integrated lightguide coupler, each of said pairs comprising one receiver and one transmitter for exchanging two way optical signals via one of a plurality of optical cables each with a single core, and wherein at least two holders hold at least two said optical cables each with a single core directly attached to two of said accesses.

9. The method for coupling an optical signal to a semiconductor circuit according to claim 1, wherein one of a plurality of pairs of photo elements each pair comprising one receiver linked via a receive link with one transmitter linked via a transmit link of an optical access made of a plastic molded structure with multi optical links and a plurality of optical accesses each made of a plastic molded structure with a single optical link are contained in said enclosure of said integrated lightguide coupler for exchanging a plurality of two way optical signals, and wherein a combination selected from one of said holder for holding the terminated ends of an optical cable with multicore directly attached to said access and a plurality of holders for holding a plurality of terminated ends of optical cables each with a single core directly attached to said plurality of accesses for directly linking at least two said pairs of said photo elements with two pairs of cores of said multicore or four of said optical cables each with a single core.

10. The method for coupling an optical signal to a semiconductor circuit according to claim 1, wherein a plurality of photo elements and a plurality of accesses each is made of a plastic molded structure for distributing optical signals selected from a group comprising receive, transmit, two way and combinations thereof via at least one of said plurality of accesses are contained in said enclosure of said integrated lightguide coupler, and wherein at least one of a plurality of holders holds at least one said terminated end directly attached to one access for optically linking of at least one of a plurality of optical cables to at least one of said accesses.

11. The method for coupling an optical signal to a semiconductor circuit according to claim 1, wherein said element and said circuit are adapted to receive an optical signal from an optical transmitter for installing an identifying data of said appliance into a memory associated with said circuit, and wherein said current data processor outputs a combined data of at least a portion of said identifying data with a current drain data for at least one of addressing and controlling the consumed power and for reporting at least one of said appliance status, the consumed power and current drain using a combined optical signal.

12. The method for coupling an optical signal to a semiconductor circuit according to claim 11, wherein one of said thyristor, triac and MOSFET of a first integrated lightguide coupler is used for controlling the consumed power.

13. The method for coupling an optical signal to a semiconductor circuit according to claim 12, wherein a second integrated lightguide coupler is a transceiver for said combined optical signal and wherein said current data processor processes the received combined optical signal for outputting an optical signal comprising said portion of said identifying data combined with commands to said first integrated lightguide coupler for controlling the power consumed.

14. The method for coupling an optical signal to a semiconductor circuit according to claim 11, wherein a second integrated lightguide coupler is one of a receiver and a transceiver for said combined optical signal and wherein said current data processor processes the received combined optical signal for outputting combined electrical signals converted from said combined optical signals for reporting the consumed power including the converting of electrical signals received into a combined optical signals.

15. The method for coupling an optical signal to a semiconductor circuit according to claim 1, wherein said plastic molded structure is made of one of a clear and a tinted resin including a coating selected from a group comprising a cut filter coat, a pass filter coat, half mirror coat and combinations thereof for providing optical links selected from a group comprising in-line single optical link, in-line two optical links, in-line three optical links, in-line more than three optical links, plurality of a single in-line optical links, plurality of two in-line optical links, a plurality of three in-line optical links and combinations thereof.

16. An integrated lightguide coupler comprising a semiconductor circuit being selected from a group comprising a current sensor, a current data processor and a combination thereof integrated with at least one photo element selected from a group comprising a photo diode, a photovoltaic cell, a photo diac, a photo thyristor, a photo triac, a photo transistor, a photo MOSFET, an LED, a laser and combinations thereof and at least one optical access made of a plastic molded structure for directly linking said optical element with a terminated end of an optical cable are all contained in a packaged plastic enclosure of said integrated lightguide coupler;

at least one holder selected from a group comprising a structured holder within said enclosure, an attachable holder and a combination thereof for holding a terminated end of at least one said optical cable selected from a group comprising lightguide, optical fiber and a combination thereof directly attached and optically linked to said access;

said integrated lightguide coupler is electrically connected via contacts of said enclosure selected from a group comprising pins, solder pins, surface mount contacts, surface mount terminals, power contacts, plugs, sockets, posts, blades, terminal blocks, screw terminals, crimp terminals, fast on terminals, solder terminals, solder contacts, and combinations thereof via one of directly and via electrical wire to an electrical appliance; and said optical cable end terminated by a sharp cut is attached and held by said holder to said access for coupling optical signals selected from a group comprising transmit, receive and two way communication with said circuit through said at least one photo element for monitoring and communicating a data pertaining to a current drawn through one of an AC power line and an AC power outlet including one of reporting and controlling the consumed power by an electrical appliance.

17. The integrated lightguide coupler according to claim 16, wherein said optical access is made of a plastic molded structure for directly attaching and optically linking said terminated end with at least two photo elements comprising one receiver and one transmitter contained in said lightguide coupler enclosure for exchanging two way optical signals via said at least one optical cable.

18. The integrated lightguide coupler according to claim 16, wherein said optical access is made of a plastic molded structure for directly attaching and optically linking said terminated end with at least three photo elements selected from one of a combination comprising one receiver with two transmitters and one transmitter with two receivers contained in said lightguide coupler enclosure for exchanging two way optical signals via said at least one optical cable.

19. The integrated lightguide coupler according to claim 16, wherein said optical access is made of a plastic molded structure for directly attaching and optically linking two terminated ends with at least two photo elements comprising one receiver and one transmitter contained in said lightguide coupler enclosure for exchanging two way optical signals via one of an optical cable with dual core and two of said optical cables each with a single core, and wherein said holder and said access are structured in one of a combination comprising said holder for holding said optical cable with dual core directly attached to said access and two said holders for holding two said optical cables each with a single core directly attached to said access.

20. The integrated lightguide coupler according to claim 16, wherein said optical access is made of a plastic molded structure for directly attaching and optically linking a plurality of terminated ends of a multicore optical cable with a plurality of photo elements selected from one of a plurality of receivers and a plurality of transmitters for propagating a plurality of one way optical signals via said access are contained in said lightguide coupler enclosure, and wherein said holder holds said multicore optical cable directly attached to said access for linking each of said photo elements with one core of said multicore.

21. The integrated lightguide coupler according to claim 16, wherein a plurality of optical accesses each made of a plastic molded structure for directly attaching and optically linking a plurality of terminated ends with of a plurality of photo elements selected from one of a plurality of receivers and a plurality of transmitters for propagating a plurality of one way optical signals via said plurality of said accesses are contained in said lightguide coupler enclosure, and wherein a plurality of holders hold said plurality of said optical cables each with a single core directly attached and linked to one of said plurality of accesses.

22. The integrated lightguide coupler according to claim 16, wherein said optical access made of a plastic molded structure for directly attaching and optically linking a plurality of terminated ends of a multicore optical cable with a plurality of pairs of photo elements are contained in said lightguide coupler enclosure, each pair of said pairs comprising one receiver and one transmitter is spaced to commensurate with said multicore optical cable for exchanging two way optical signals via one core of said multicore, and wherein said holder holds said multicore optical cable directly attached to said access for linking at least two said pairs with at least two cores of said multicore.

23. The integrated lightguide coupler according to claim 16, wherein a plurality of optical accesses made of a plastic molded structure each linked with one pair of a plurality of pairs of photo elements comprising one receiver and one transmitter are contained in said lightguide coupler enclosure, each said pair for exchanging two way optical signals via one of a plurality of said optical cables each with a single core and wherein a plurality of holders hold said plurality of optical cables directly attached to said accesses for optically linking each said pair with one of said plurality of optical cables.

24. The integrated lightguide coupler according to claim 16, wherein one of an optical access with multi links made of a plastic molded structure and a plurality of optical accesses each made of a plastic molded structure with a single link for linking a plurality of pairs of photo elements each pair of said pairs comprising one receiver linked via a receive link and one transmitter linked via a transmit link are contained in said lightguide coupler enclosure, each pair is optically linked via one of two links of said multi links with two cores of a multicore optical cable and via two said single link with two said optical cables each with a single core for exchanging two way optical signals via two cores of said multicore or via two said single cores, and wherein one of said holder holds the terminated ends of said multicore optical cable directly attached to said access and a plurality of holders hold the terminated ends of a plurality of said optical cables each with a single core directly attached to said accesses for optically linking at least two of said pairs with two pairs of cores of said multicore or four of said optical cable each with a single core.

25. The integrated lightguide coupler according to claim 16, wherein a plurality of photo elements and a plurality of accesses each made of a plastic molded structure for distributing optical signals selected from a group comprising receive, transmit, two way and combinations thereof are contained in said lightguide coupler enclosure, and wherein at least one of a plurality of holders holds at least one said terminated end of at least one of a plurality of optical cables directly attached and optically linked to at least one of said accesses.

26. The integrated lightguide coupler according to claim 16, wherein said element and said circuit are adapted to receive an optical signal from an optical transmitter for installing an identifying data of said appliance into a memory associated with said circuit, and wherein said current data processor outputs a combined data of at least a portion of said identifying data with a current drain data for at least one of addressing and controlling the consumed power and for reporting at least one of said appliance status, the consumed power and the current drain using a combined optical signal.

27. The integrated lightguide coupler according to claim 26, wherein one of said thyristor, triac and MOSFET of a first lightguide coupler enclosure is used for controlling the consumed power.

28. The integrated lightguide coupler according to claim 27, wherein a second lightguide coupler enclosure is a transceiver for said combined optical signal and wherein said current data processor processes the received said combined optical signal for outputting an optical signal comprising said portion of said identifying data combined with commands to said first packaged semiconductor for controlling the power consumed.

29. The integrated lightguide coupler according to claim 26, wherein a second lightguide coupler enclosure is one of a receiver and a transceiver for said combined optical signal and wherein said current data processor processes the received said combined optical signal for outputting combined electrical signals converted from said combined optical signals for reporting the consumed power including the converting of electrical signals received into a combined optical signals.

30. The integrated lightguide coupler according to claim 16, wherein said plastic molded structure is made of one of a clear and a tinted resin including a coating selected from a group comprising a cut filter coat, a pass filter coat, half mirror coat and combinations thereof for providing optical links selected from a group comprising in-line single optical link, in-line two optical links, in-line three optical links, in-line more than three optical links, plurality of a single in-line optical links, plurality of two in-line optical links, a plurality of three in-line optical links and combinations thereof.

* * * * *